(12) United States Patent
Sasagawa et al.

(10) Patent No.: US 8,604,472 B2
(45) Date of Patent: Dec. 10, 2013

(54) SEMICONDUCTOR DEVICE

(71) Applicant: Semiconductor Energy Laboratory Co., Ltd., Atsugi (JP)

(72) Inventors: Shinya Sasagawa, Chigasaki (JP); Hiroshi Fujiki, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/666,147

(22) Filed: Nov. 1, 2012

(65) Prior Publication Data

US 2013/0112968 A1    May 9, 2013

(30) Foreign Application Priority Data

Nov. 9, 2011    (JP) ................................. 2011-245058

(51) Int. Cl.
*H01L 29/10* (2006.01)

(52) U.S. Cl.
USPC ............................................. 257/43; 257/59

(58) Field of Classification Search
USPC ..................................................... 257/43, 59
See application file for complete search history.

(56) References Cited

U.S. PATENT DOCUMENTS

| | | | |
|---|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced At Room Temperature,", Appl. Phys. Lett. (Applied Physics Letters) , Sep. 27, 2004, vol. 85, No. 13, pp. 2541-2543.

(Continued)

*Primary Examiner* — Douglas Menz
(74) *Attorney, Agent, or Firm* — Eric J. Robinson; Robinson Intellectual Property Law Office, P.C.

(57) ABSTRACT

A semiconductor device which achieves miniaturization with favorable characteristics maintained is provided. In addition, a miniaturized semiconductor device is provided with high yield. In a semiconductor device including an oxide semiconductor, the contact resistance between the oxide semiconductor and the source electrode or the drain electrode is reduced with miniaturization advanced. Specifically, an oxide semiconductor film is processed to be an island-shaped oxide semiconductor film whose side surface has a tapered shape. Further, the side surface has a taper angle greater than or equal to 1° and less than 10°, and at least part of the source electrode and the drain electrode is in contact with the side surfaces of the oxide semiconductor film. With such a structure, the contact region of the oxide semiconductor film and the source electrode or the drain electrode is increased, whereby the contact resistance is reduced.

10 Claims, 17 Drawing Sheets

(56) References Cited

U.S. PATENT DOCUMENTS

| | | |
|---|---|---|
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,821,002 B2 | 10/2010 | Yamazaki et al. |
| 8,253,138 B2 | 8/2012 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0027980 A1 | 2/2011 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| WO | WO-2004/114391 | 12/2004 |

OTHER PUBLICATIONS

Dembo.H et al., "RFCPUs on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of Igzo Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3-Ga2ZnO4-ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

(56) References Cited

OTHER PUBLICATIONS

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness Probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In, Ga; m=Integer) Described by four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUs on Flexible and Glass Substrates for Secure RFID systems,", Journal of Solid-State Circuits , 2008, vol. 43, No. 1, pp. 292-299.

Ohara.H et al., "Amorphous In—Ga—Zn-Ovide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for Amoled Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputterins,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Proerties,", SID Digest '09 : International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent Am-Oled Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn-Oxide TFT,", AM-FPD '09 Digest of Technical Papers, Jul. 1, 2009, pp. 33-36.

Hirao.T et al., "Novel Top-Gate Zinc Oxide thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

(56) References Cited

OTHER PUBLICATIONS

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

SEMICONDUCTOR DEVICE

BACKGROUND OF THE INVENTION

1. Field of the Invention

The disclosed invention relates to a semiconductor device and a method for manufacturing the semiconductor device.

In this specification and the like, a semiconductor device refers to all types of devices which can function by utilizing semiconductor characteristics; an electro-optical device, a light-emitting display device, a semiconductor circuit, and an electronic device are all semiconductor devices.

2. Description of the Related Art

A technique by which transistors are formed using semiconductor thin films over a substrate having an insulating surface has been attracting attention. The transistor is applied to a wide range of semiconductor electronic devices such as an integrated circuit (IC) and an image display device (also simply referred to as display device). A silicon-based semiconductor material is widely known as a material for a semiconductor thin film applicable to a transistor. As another material, an oxide semiconductor has been attracting attention.

For example, Patent Document 1 and Patent Document 2 disclose a technique by which a transistor is manufactured using zinc oxide or an In—Ga—Zn—O-based material as an oxide semiconductor and is used as a switching element of a pixel or the like of a display device.

REFERENCE

[Patent Document 1]
[Patent Document 1] Japanese Published Patent Application No. 2007-123861
[Patent Document 2] Japanese Published Patent Application No. 2007-096055

SUMMARY OF THE INVENTION

In a transistor including an oxide semiconductor, in order to achieve high-speed operation, low power consumption, high integration, or the like of the transistor, it is necessary to miniaturize the transistor.

In order to achieve miniaturization of the transistor including an oxide semiconductor, each area, line width, or the like of components of a transistor, such as an oxide semiconductor film, a gate electrode, a source electrode, and a drain electrode needs to be reduced. In addition, a contact region where the oxide semiconductor film is in contact with the source electrode or the drain electrode needs to be reduced. However, in accordance with the reduction of the contact region, contact resistance between the oxide semiconductor film and the source electrode or the drain electrode is increased, so that the on-state characteristics (e.g., on-state current or field-effect mobility) which are one kind of electrical characteristics of the transistor can be degraded.

As a method for reducing the contact region, for example, a structure of a transistor in which a side surface of the oxide semiconductor film is connected to a side surface of a conductive film which is to be a source electrode or a drain electrode in a lateral direction can be employed. However, with the use of this method, when the thickness of the oxide semiconductor film is thinned, a contact region of the oxide semiconductor film and the source electrode or the drain electrode is decreased, so that the contact resistance can be increased.

In view of this, it is an object of one embodiment of the present invention to provide a semiconductor device which achieves miniaturization with favorable characteristics maintained. Another object of one embodiment of the present invention is to provide the miniaturized semiconductor device with high yield.

In a semiconductor device including an oxide semiconductor, the contact resistance between the oxide semiconductor and the source electrode or the drain electrode is reduced with miniaturization advanced. Specifically, an oxide semiconductor film is processed to be an island-shaped oxide semiconductor film whose side surface has a tapered shape. Further, the side surface has a taper angle greater than or equal to 1° and less than 10°, and at least part of the source electrode or the drain electrode is in contact with the side surface of the oxide semiconductor film. With such a structure, the contact region of the oxide semiconductor film and the source electrode or the drain electrode is increased, whereby the contact resistance can be reduced.

In the case where an oxide semiconductor film includes a crystal portion, a side surface of the oxide semiconductor film including the crystal portion contains more oxygen vacancies and tends to have lower resistance than a top surface of the oxide semiconductor film including the crystal portion. Therefore, the side surface has a tapered shape and the taper angle is greater than or equal to 1° and less than 10°, whereby the contact region of the oxide semiconductor film and the source electrode or the drain electrode is increased and the contact resistance can be reduced. Details thereof will be described below.

An embodiment of the disclosed invention is a semiconductor device including an island-shaped oxide semiconductor film, a gate insulating film provided over the oxide semiconductor film, a gate electrode being in contact with the gate insulating film and provided in a position overlapping with the oxide semiconductor film, an interlayer insulating film formed over the gate insulating film and the gate electrode, an opening formed in the gate insulating film and the interlayer insulating film and reaching the oxide semiconductor film, and a source electrode or a drain electrode formed to fill the opening and being in contact with the oxide semiconductor film, in which a side surface of the oxide semiconductor film has a taper angle greater than or equal to 1° and less than 10° and at least part of the source electrode or the drain electrode is in contact with the side surface.

In the above structure, the side surface of the oxide semiconductor film may have a plurality of taper angles, and at least one of the taper angles may be greater than or equal to 1° and less than 10°.

The side surface of the oxide semiconductor film has a taper angle in the above range, whereby the contact region of the oxide semiconductor film and the source electrode or the drain electrode which is in contact with the side surface of the oxide semiconductor film can be increased. Further, the source electrode and the drain electrode can be in contact with the oxide semiconductor film without disconnection. Furthermore, the side surface of the oxide semiconductor film can be used as a contact region, whereby the area of the oxide semiconductor film can be reduced when an intended area of the contact region is required.

A technical idea of the present invention is that an inclined plane formed at the side surface of the oxide semiconductor film is in contact with at least part of the source electrode or the drain electrode, whereby the contact region of the oxide semiconductor film and the source electrode or the drain electrode is increased. Therefore, the present invention also includes a structure or the like including a side surface having two or more shapes such as a perpendicular shape at a bottom surface side of the oxide semiconductor film and an inclined shape at a top surface side of the oxide semiconductor film. In addition, the present invention also includes a side surface with continuous curvature. The taper angle refers to a tilt angle formed by a bottom surface and the side surface of the oxide semiconductor film when the oxide semiconductor film is observed in a direction perpendicular to its cross section. A taper angle of the side surface with continuous curvature is a tilt angle formed by a bottom surface of the oxide semiconductor film and a given point of the side surface with continuous curvature.

In the above structure, the oxide semiconductor film includes a channel formation region and a pair of low resistance regions with the channel formation region provided therebetween. The oxide semiconductor film includes the low resistance regions, whereby contact resistance of the oxide semiconductor film and the source electrode or the drain electrode can be further reduced. In this specification and the like, the low resistance region refers to a region where resistance is lower than that of a channel formation region formed in the oxide semiconductor film. The low resistance region can be formed by introducing impurities to the oxide semiconductor film or increasing oxygen vacancies in the oxide semiconductor film.

In the above structure, the oxide semiconductor film preferably includes at least one of oxides of indium, zinc, gallium, zirconium, tin, gadolinium, titanium, and cerium. In addition, it is preferable that the oxide semiconductor film include a crystal portion and the c-axis be aligned in the direction parallel to a normal vector of a surface where the oxide semiconductor film is formed in the crystal portion.

According to an embodiment of the disclosed invention, the size of a transistor can be sufficiently reduced with favorable electrical characteristics maintained.

By sufficiently reducing the size of the transistor, an area of a semiconductor device is decreased, and the number of semiconductor devices manufactured with one substrate is increased. Thus, the manufacturing cost per semiconductor device is saved. Further, the size of the transistor is sufficiently reduced, whereby new function or the like can be added using a space formed by the reduction in a semiconductor device and a function of the semiconductor device can be further improved compared to that of the semiconductor device which is substantially the same size as the former semiconductor device. In other words, miniaturization of a transistor including an oxide semiconductor is achieved according to one embodiment of the disclosed invention, and therefore a variety of advantageous effects accompanying the miniaturization can be obtained.

DETAILED DESCRIPTION OF THE INVENTION

Figure 1A:
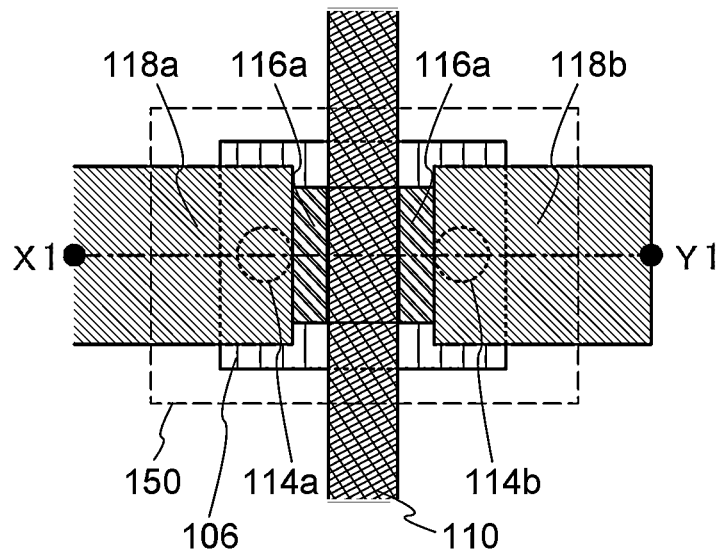
FIGS. 1A to 1C are a plan view and cross-sectional views illustrating an embodiment of a semiconductor device.

Hereinafter, embodiments of the invention disclosed in this specification will be described with reference to the accompanying drawings. Note that the present invention is not limited to the following description and it will be readily appreciated by those skilled in the art that modes and details can be modified in various ways without departing from the spirit and the scope of the present invention. Therefore, the present invention should not be construed as being limited to the description in the following embodiments.

Note that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not limit the components numerically.

Note that in this specification and the like, the term such as "over" or "below" does not necessarily mean that a component is placed "directly on" or "directly under" another component. For example, the expression "a gate electrode over a gate insulating film" can mean the case where there is an additional component between the gate insulating film and the gate electrode.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

Note that in this specification and the like, the term "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

(Embodiment 1)

In this embodiment, one embodiment of a semiconductor device and a method for manufacturing the semiconductor device will be described with reference to FIGS. 1A to 1C, FIGS. 2A to 2D, FIGS. 3A to 3C, and FIG. 4.

<Structural Example of Semiconductor Device>

Figure 1B:
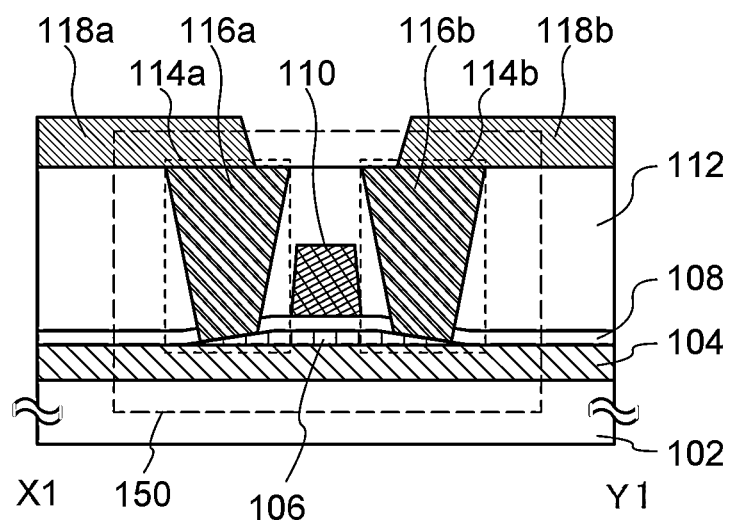
Figure 1C:
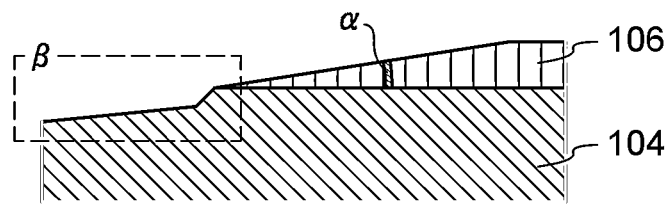

As an example of a semiconductor device, a plan view and cross-sectional views of a top-gate transistor are illustrated in FIGS. 1A, 1B, and 1C. Note that FIG. 1A shows a plan view and FIG. 1B is a cross-sectional view taken along dashed line X1-Y1 in FIG. 1A. Further, FIG. 1C is a cross-sectional view of part of a base insulating film 104 and an oxide semiconductor film 106 illustrated in FIG. 1B which is enlarged. Note that in FIG. 1A, some components of a transistor 150 (e.g., a gate insulating film 108 or the like) are not illustrated for simplification.

The transistor 150 illustrated in FIGS. 1A and 1B includes a base insulating film 104 formed over a substrate 102, an oxide semiconductor film 106 formed over the base insulating film 104, a gate insulating film 108 formed over the oxide semiconductor film 106, a gate electrode 110 formed in contact with the gate insulating film 108 and provided at a position overlapping with the oxide semiconductor film 106, an interlayer insulating film 112 formed over the gate insulating film 108 and the gate electrode 110, an opening 114a and an opening 114b provided in the gate insulating film 108 and the interlayer insulating film 112, and a source electrode 116a and a drain electrode 116b provided to fill the opening 114a and the opening 114b. Moreover, the transistor 150 may include a wiring 118a and a wiring 118b connected to the source electrode 116a and the drain electrode 116b.

As illustrated in FIGS. 1B and 1C, the oxide semiconductor film 106 has a taper angle greater than or equal to 1° and less than 10° at the side surface. In this specification and the like, the taper angle refers to a tilt angle formed by a bottom surface and the side surface of the oxide semiconductor film 106 when the oxide semiconductor film 106 is observed in a direction perpendicular to its cross section. In FIG. 1C, a portion represented by α is the taper angle.

The oxide semiconductor film 106 can be formed by etching an oxide semiconductor film by a dry etching method. Further, in this embodiment, as an etching gas, $BCl_3$, $Cl_2$, $O_2$, and the like are used, whereby the taper angle is greater than or equal to 1° and less than 10° at the side surface. Further, a dry etching apparatus using a high-density plasma source such as ECR (Electron Cyclotron Resonance) or ICP (Inductive Coupled Plasma) can be used to improve an etching rate.

Note that, as illustrated in a region represented by β of FIG. 1C, the base insulating film 104 is also etched and partially becomes thinner depending on etching conditions. Note that the base insulating film 104 can be prevented from being thin by adjusting the etching conditions or changing the etching apparatus. By adjusting the etching conditions, the taper angle (α) in an end portion of the oxide semiconductor film 106 can be greater than or equal to 1° and less than 10°.

The thickness of the oxide semiconductor film 106 is greater than 5 nm and less than or equal to 200 nm, preferably greater than or equal to 10 nm and less than or equal to 30 nm, more preferably greater than or equal to 10 nm and less than or equal to 20 nm. Further, the oxide semiconductor film 106 preferably has a structure with crystallinity, such as a single crystal structure, a polycrystalline structure, or a microcrystalline structure.

In this embodiment, the oxide semiconductor film 106 is preferably a c-axis aligned crystalline oxide semiconductor (CAAC-OS) film. Note that the CAAC-OS film will be described later in detail in description of a method for manufacturing the transistor 150.

The source electrode 116a and the drain electrode 116b are at least partly in contact with the side surfaces each including a taper angle greater than or equal to 1° and less than 10° of the oxide semiconductor film 106.

With such a structure, a contact region of the oxide semiconductor film 106 and the source electrode 116a or the drain electrode 116b can be increased. Further, the source electrode 116a and the drain electrode 116b can be in contact with the oxide semiconductor film 106 without disconnection. Furthermore, the side surface of the oxide semiconductor film 106 can be used as a contact region, whereby the area of the oxide semiconductor film 106 can be reduced when an intended area of the contact region is required.

In this manner, the area of the oxide semiconductor film 106 is reduced and the contact region of the oxide semiconductor film 106 and the source electrode 116a or the drain electrode 116b is increased, whereby the size of the transistor 150 can be sufficiently reduced with favorable electrical characteristics maintained.

Therefore, an area of a semiconductor device is decreased, and the number of semiconductor devices manufactured with one substrate is increased. Thus, the manufacturing cost per semiconductor device is saved. Further, the size of the transistor is sufficiently reduced, whereby new function or the like can be added using a space formed by the reduction in a semiconductor device and a function of the semiconductor device can be further improved compared to that of the semiconductor device which is substantially the same size as the former semiconductor device. In other words, miniaturization of a transistor including an oxide semiconductor is achieved according to one embodiment of the disclosed invention, and therefore a variety of advantageous effects accompanying the miniaturization can be obtained.

Note that the details of the other components will be described in description of a method for manufacturing the transistor 150 below, with reference to FIGS. 2A to 2D, FIGS. 3A to 3C, and FIG. 4.

<Method for Manufacturing Transistor 150>

An example of a method for manufacturing the transistor 150 illustrated in FIGS. 1A to 1C of this embodiment is described below with reference to FIGS. 2A to 2D, FIGS. 3A to 3C, and FIG. 4.

First, the substrate 102 is prepared. There is no particular limitation on a substrate that can be used as the substrate 102 as long as it has at least heat resistance to withstand heat treatment performed later. For example, a glass substrate of barium borosilicate glass, aluminoborosilicate glass, or the like, a ceramic substrate, a quartz substrate, or a sapphire substrate can be used. Alternatively, a single crystal semiconductor substrate or a polycrystalline semiconductor substrate of silicon, silicon carbide, or the like; a compound semiconductor substrate of silicon germanium or the like; an SOI substrate; or the like can be used.

A flexible substrate may alternatively be used as the substrate 102. When a flexible substrate is used, a transistor including the oxide semiconductor film 106 may be directly formed over the flexible substrate. Alternatively, a transistor including the oxide semiconductor film 106 may be formed over a manufacturing substrate, and then, the transistor may be separated and transferred to a flexible substrate. Note that in order to separate the transistor from the manufacturing substrate and transfer it to the flexible substrate, a separation layer may be provided between the manufacturing substrate and the transistor including the oxide semiconductor film 106.

Figure 2A:
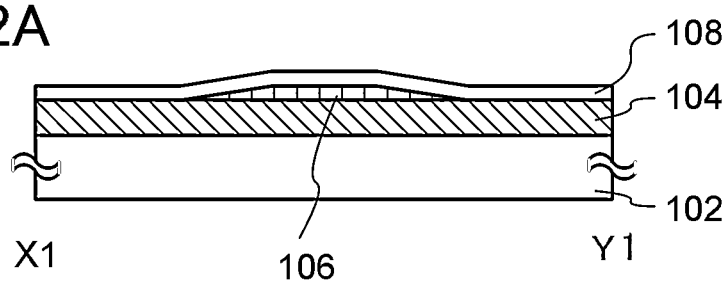
FIGS. 2A to 2D are cross-sectional views illustrating an example of a manufacturing process of the semiconductor device.
Figure 2B:
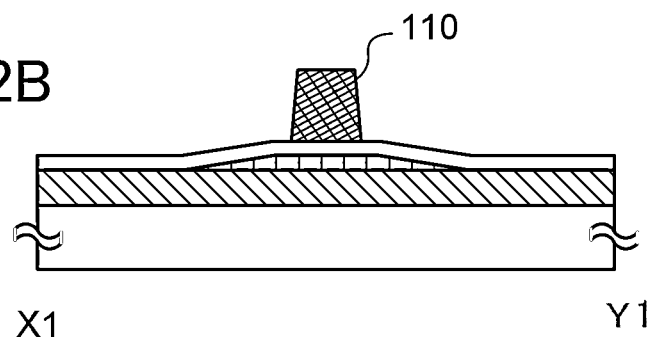

Next, the base insulating film 104 is formed over the substrate 102 (see FIG. 2A). The base insulating film 104 has an effect to prevent diffusion of an impurity element such as hydrogen, moisture, or an alkali metal from the substrate 102, and can be formed with a single-layer structure or a stacked structure using one or more of films of a silicon oxide, a silicon nitride, a silicon oxynitride, a silicon nitride oxide, an aluminum oxide, an aluminum nitride, an aluminum oxynitride, an aluminum nitride oxide, a hafnium oxide, a gallium oxide, and a mixed material thereof.

Further, as another effect of the base insulating film 104, oxygen can be supplied to the oxide semiconductor film 106 formed later. For example, in the case where an insulating film including oxide is formed as the base insulating film 104, by heating the base insulating film 104, part of contained oxygen can be released. Thus, oxygen can be supplied to the oxide semiconductor film 106, and oxygen vacancies in the oxide semiconductor film 106 can be filled accordingly. In particular, the base insulating film 104 preferably contains a large amount of oxygen which exceeds at least the stoichiometry thereof. For example, a film of silicon oxide represented by the formula $SiO_{2+\alpha}$ ($\alpha>0$) is preferably used as the base insulating film 104. When such a silicon oxide film is used as the base insulating film 104, oxygen can be supplied to the oxide semiconductor film 106, so that the transistor 150 using the oxide semiconductor film 106 can have favorable transistor characteristics.

Note that the base insulating film 104 is not necessarily provided. For example, with the use of a substrate or the like from which impurities such as hydrogen, moisture, or an alkali metal does not diffuse as the substrate 102, the oxide semiconductor film 106 may be provided on the substrate 102 directly. However, as described in this embodiment, the base insulating film 104 is preferably provided.

The substrate 102 may be subjected to plasma treatment or the like before the base insulating film 104 is formed. As plasma treatment, reverse sputtering in which an argon gas is introduced and plasma is generated can be performed, for example. The reverse sputtering is a method in which voltage is applied to the substrate 102 side with the use of an RF power source in an argon atmosphere and plasma is generated in the vicinity of the substrate 102 so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface of the substrate 102.

Next, an oxide semiconductor film is formed over the base insulating film 104 and a photolithography step and an etching step are performed. Thus, the oxide semiconductor film 106 is formed (see FIG. 2A). The oxide semiconductor film 106 is preferably a CAAC-OS film. Note that the base insulating film 104 and the oxide semiconductor film 106 are preferably formed successively without exposure to the air.

Here, the CAAC-OS film which can be used for the oxide semiconductor film 106 is described in detail.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal portions in the vicinity of the surface of the oxide semiconductor film becomes higher than that in a vicinity of a surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With the use of the CAAC-OS film in a transistor, change in electric characteristics of the transistor due to irradiation with visible light or ultraviolet light can be reduced. Further, shift and variation of the threshold voltage can be suppressed. Thus, the transistor has high reliability.

In a crystal portion or a crystalline oxide semiconductor layer, defects in the bulk can be further reduced. Further, when the surface flatness of the crystal portion or the crystalline oxide semiconductor film is enhanced, a top-gate transistor including the oxide semiconductor can have higher field-effect mobility than a transistor including an amorphous oxide semiconductor. In order to improve the surface flatness of the oxide semiconductor film, the oxide semiconductor is preferably formed over a flat surface. Specifically, the oxide semiconductor may be formed over a surface with the average surface roughness (Ra) of less than or equal to 0.15 nm, preferably less than or equal to 0.1 nm.

Note that Ra is obtained by expanding arithmetic average roughness, which is defined by JIS B 0601: 2001 (ISO4287: 1997), into three dimensions so as to be applicable to a surface. Moreover, Ra can be expressed as average value of the absolute values of deviations from a reference surface to a specific surface and is defined by the following formula.

$$Ra = \frac{1}{S_0} \int_{y_1}^{y_2} \int_{x_1}^{x_2} |f(x, y) - Z_0| dx dy \quad \text{[FORMULA 1]}$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. Moreover, $S_0$ represents the area of a rectangle which is obtained by projecting the specific surface on the xy plane, and $Z_0$ represents the height of the reference surface (the average height of the specific surface). Ra can be measured using an atomic force microscope (AFM).

An oxide semiconductor used for the oxide semiconductor film 106 preferably contains at least indium (In) or zinc (Zn). In particular, In and Zn are preferably contained. As a stabilizer for reducing variation in electric characteristics of a transistor including the oxide semiconductor film, gallium (Ga) is preferably additionally contained. Tin (Sn) is preferably contained as a stabilizer. It is also preferable that one or more kinds of elements selected from hafnium (Hf), zirconium (Zr), titanium (Ti), scandium (Sc), yttrium (Y), and lanthanoid (e.g., cerium (Ce), neodymium (Nd), or gadolinium (Gd)) be contained as a stabilizer.

As the oxide semiconductor, for example, any of the following can be used: indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, an "In—Ga—Zn-based oxide" means an oxide containing In, Ga, and Zn as its main components and there is no particular limitation on the ratio of In:Ga:Zn. The In—Ga—Zn-based oxide may contain a metal element other than In, Ga, and Zn.

Alternatively, a material represented by $InMO_3(ZnO)_m$ (m>0, m is not an integer) may be used as the oxide semiconductor. Note that M represents one or more metal elements selected from Ga, Fe, Mn, and Co, or the above-described element as a stabilizer. Alternatively, as the oxide semiconductor, a material represented by $In_2SnO_5(ZnO)_n$ (n>0, n is an integer) may be used.

For example, an In—Ga—Zn-based oxide with an atomic ratio where In:Ga:Zn=1:1:1, In:Ga:Zn=3:1:2, or In:Ga:Zn=2:1:3, or any of oxides whose composition is in the neighborhood of the above compositions can be used.

It is preferable that hydrogen or water be contained in the oxide semiconductor film 106 as little as possible in the formation step of the oxide semiconductor film 106. For example, as pretreatment of the formation step of the oxide semiconductor film 106, it is preferable that the substrate 102 provided with the base insulating film 104 be preheated in a preheating chamber of a sputtering apparatus to remove and exhaust an impurity such as hydrogen or moisture adsorbed to the substrate 102 and the base insulating film 104. Further, the oxide semiconductor film 106 is preferably formed in a deposition chamber from which moisture has been exhausted.

In order to remove the moisture in the preheating chamber and the deposition chamber, an entrapment vacuum pump, for example, a cryopump, an ion pump, or a titanium sublimation pump is preferably used. Further, an evacuation unit may be a turbo pump provided with a cold trap. From the preheating chamber and the deposition chamber which are evacuated with a cryopump, a hydrogen atom, a compound containing a hydrogen atom such as water ($H_2O$) (more preferably, also a compound containing a carbon atom), and the like are removed, whereby the concentration of an impurity such as hydrogen or moisture in the oxide semiconductor film 106 can be reduced.

In this embodiment, an In—Ga—Zn-based oxide is formed as the oxide semiconductor film 106 by a sputtering method. The oxide semiconductor film 106 can be formed by a sputtering method in a rare gas (typically argon) atmosphere, an oxygen atmosphere, or a mixed atmosphere of a rare gas and oxygen.

As a target used in a sputtering method for forming an In—Ga—Zn-based oxide as the oxide semiconductor film 106, for example, a metal oxide target having an atomic ratio of In:Ga:Zn=1:1:1, a metal oxide target having an atomic ratio of In:Ga:Zn=3:1:2, or a metal oxide target having an atomic ratio of In:Ga:Zn=2:1:3 can be used, for example. Note that the target used for forming the oxide semiconductor film 106 is not limited to the targets including the above materials and having the above ratios.

Further, when the oxide semiconductor film 106 is formed using the above-described metal oxide target, the composition of the target is different from that of the thin film formed over the substrate in some cases. For example, when the metal oxide target having a composition ratio of $In_2O_3$:$Ga_2O_3$:ZnO=1:1:1 [molar ratio] is used, the composition ratio of the oxide semiconductor film 106, which is the thin film, becomes $In_2O_3$:$Ga_2O_3$:ZnO=1:1:0.6 to 1:1:0.8 [molar ratio] in some cases, though it depends on the film formation conditions. This is because in formation of the oxide semiconductor film 106, ZnO is sublimed, or because a sputtering rate differs between the components of $In_2O_3$, $Ga_2O_3$, and ZnO.

Accordingly, when a thin film having a preferable composition ratio is formed, a composition ratio of the metal oxide target needs to be adjusted in advance. For example, in order to make the composition ratio of the thin oxide semiconductor film 106 be $In_2O_3$:$Ga_2O_3$:ZnO=1:1:1 [molar ratio], the composition ratio of the metal oxide target is made to be $In_2O_3$:

Ga$_2$O$_3$:ZnO=1:1:1.5 [molar ratio]. In other words, the ZnO content of the metal oxide target is made higher in advance. The composition ratio of the target is not limited to the above value, and can be adjusted as appropriate depending on the film formation conditions or the composition of the thin film to be formed. Further, it is preferable to increase the ZnO content of the metal oxide target because in that case, the crystallinity of the obtained thin film is improved.

The relative density of the metal oxide target is higher than or equal to 90% and lower than or equal to 100%, preferably higher than or equal to 95% and lower than or equal to 99.9%. By using the metal oxide target with high relative density, the oxide semiconductor film 106 can be a dense film.

As a sputtering gas used for forming the oxide semiconductor film 106, it is preferable to use a high-purity gas from which an impurity such as hydrogen, water, a hydroxyl group, or hydride is removed.

There are three methods for forming a CAAC-OS film when the CAAC-OS film is used as the oxide semiconductor film 106. The first method is to form an oxide semiconductor film at a temperature higher than or equal to 200° C. and lower than or equal to 450° C. to form, in the oxide semiconductor film, crystal parts in which the c-axes are aligned in the direction parallel to a normal vector of a surface where the oxide semiconductor film is formed or a normal vector of a surface of the oxide semiconductor film. The second method is to form an oxide semiconductor film with a small thickness and then heat it at a temperature higher than or equal to 200° C. and lower than or equal to 700° C., to form, in the oxide semiconductor film, crystal parts in which the c-axes are aligned in the direction parallel to a normal vector of a surface where the oxide semiconductor film is formed or a normal vector of a surface of the oxide semiconductor film. The third method is to form a first oxide semiconductor film with a small thickness, then heat it at a temperature higher than or equal to 200° C. and lower than or equal to 700° C., and form a second oxide semiconductor film, to form, in the oxide semiconductor film, crystal parts in which the c-axes are aligned in the direction parallel to a normal vector of a surface where the oxide semiconductor film is formed or a normal vector of a surface of the oxide semiconductor film.

By heating the substrate 102 during film formation, the concentration of impurities such as hydrogen or water in the oxide semiconductor film 106 can be reduced. In addition, damage by sputtering can be reduced, which is preferable. The oxide semiconductor film 106 may be formed by an ALD (atomic layer deposition) method, an evaporation method, a coating method, or the like.

Note that when a crystalline (single-crystal or microcrystalline) oxide semiconductor film other than a CAAC-OS film is formed as the oxide semiconductor film 106, there is no particular limitation on the deposition temperature.

In this embodiment, as a method for forming the oxide semiconductor film 106, the oxide semiconductor film is etched by a dry etching method. As an etching gas, BCl$_3$, Cl$_2$, O$_2$, and the like can be used. A dry etching apparatus using a high-density plasma source such as ECR or ICP can be used to improve an etching rate.

In this embodiment, with the use of an ICP etching apparatus and by appropriately adjusting the etching conditions (e.g., the amount of power applied to a coil-shaped electrode, the amount of power applied to an electrode on a substrate side, the electrode temperature on the substrate side, or the like), the oxide semiconductor film can be etched into a desired island shape. For example, the conditions for dry-etching the 20-nm-thick In—Ga—Zn—O film to be the oxide semiconductor film 106 are as follows: the amount of power applied to a coil-shaped electrode is 2000 W; the amount of bias power applied to an electrode on the substrate 102 side is 600 W (RF); the flow rate of a Cl$_2$ gas introduced into the etching apparatus is 100 sccm; the pressure is 1.5 Pa; and the substrate temperature is −10° C. in the first step of the dry etching, and the amount of power applied to a coil-shaped electrode is 1500 W; the amount of bias power applied to an electrode on the substrate 102 side is 200 W (RF); the flow rate of a Cl$_2$ gas and an O$_2$ gas introduced into the etching apparatus are 100 sccm and 30 sccm, respectively; the pressure is 1.5 Pa; and the substrate temperature is −10° C. in the second step of the dry etching.

Note that the base insulating film 104 is also etched and partially becomes thin depending on etching conditions. Note that it is possible not to make the base insulating film 104 thin by adjusting the etching conditions or changing the etching apparatus. In this manner, by adjusting the etching conditions, the taper angle at the side surface of the oxide semiconductor film 106 can be greater than or equal to 1° and less than 10°.

After the oxide semiconductor film 106 is formed, heat treatment may be performed on the oxide semiconductor film 106. The temperature of the heat treatment is higher than or equal to 300° C. and lower than or equal to 700° C., or lower than the strain point of the substrate. When the heat treatment is performed, excess hydrogen (including water and a hydroxyl group) can be removed. Note that the heat treatment is also referred to as dehydration treatment (dehydrogenation treatment) in this specification and the like in some cases.

The heat treatment can be performed in such a manner that, for example, an object to be processed is introduced into an electric furnace in which a resistance heater or the like is used and heated at 450° C. in a nitrogen atmosphere for one hour. During the heat treatment, the oxide semiconductor film 106 is not exposed to air to prevent entry of water and hydrogen.

The heat treatment apparatus is not limited to the electric furnace and may be an apparatus for heating an object by thermal radiation or thermal conduction from a medium such as a heated gas. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

For example, as the heat treatment, the GRTA process may be performed as follows. The object is put in a heated inert gas atmosphere, heated for several minutes, and taken out of the inert gas atmosphere. The GRTA process enables high-temperature heat treatment for a short time. Moreover, the GRTA process can be employed even when the temperature exceeds the upper temperature limit of the object. Note that the inert gas may be switched to a gas containing oxygen during the process.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is greater than or equal to 6N (99.9999%), preferably greater than or equal to 7N (99.99999%) (that is, the concentration of the impurities is less than or equal to 1 ppm, preferably less than or equal to 0.1 ppm).

The dehydration treatment (dehydrogenation treatment) might be accompanied by elimination of oxygen which is a main constituent material for an oxide semiconductor film to lead to a reduction in oxygen. An oxygen vacancy exists in a portion where oxygen is eliminated in an oxide semiconductor film, and a donor level which leads to a change in the electric characteristics of a transistor is formed owing to the oxygen vacancy. Therefore, in the case where the dehydration treatment (dehydrogenation treatment) is performed, oxygen is preferably supplied to the oxide semiconductor film 106. By supply of oxygen to the oxide semiconductor film 106, oxygen vacancies in the film can be filled.

The oxygen vacancy in the oxide semiconductor film 106 may be filled in the following manner for example: after the oxide semiconductor film 106 is subjected to the dehydration treatment (dehydrogenation treatment), a high-purity oxygen gas, a high-purity nitrous oxide gas, or ultra dry air (the moisture amount is less than or equal to 20 ppm (−55° C. by conversion into a dew point), preferably less than or equal to 1 ppm, more preferably less than or equal to 10 ppb, in the measurement with the use of a dew point meter of a cavity ring down laser spectroscopy (CRDS) system) may be introduced into the same furnace. It is preferable that water, hydrogen, and the like not be contained in the oxygen gas or the nitrous oxide gas. The purity of the oxygen gas or the nitrous oxide gas which is introduced into the heat treatment apparatus is preferably 6N (99.9999%) or more, further preferably 7N (99.99999%) or more (i.e., the impurity concentration in the oxygen gas or the nitrous oxide gas is preferably less than or equal to 1 ppm, further preferably less than or equal to 0.1 ppm).

As an example of a method for supplying oxygen to the oxide semiconductor film 106, oxygen (including at least any one of oxygen radicals, oxygen atoms, and oxygen ions) may be added to the oxide semiconductor film 106 in order to supply oxygen to the oxide semiconductor film 106. An ion implantation method, an ion doping method, a plasma immersion ion implantation method, plasma treatment, or the like can be used as a method for adding oxygen.

As another example of a method for supplying oxygen to the oxide semiconductor film 106, oxygen may be supplied to the oxide semiconductor film 106 in such a manner that the base insulating film 104, the gate insulating film 108 to be formed later, or the like is heated and part of oxygen is released.

As described above, after formation of the oxide semiconductor film 106, it is preferable that dehydration treatment (dehydrogenation treatment) be performed to remove hydrogen or moisture from the oxide semiconductor film 106, so that the oxide semiconductor film is highly purified so as to include as few impurities as possible, and oxygen whose amount is reduced in the dehydration treatment (dehydrogenation treatment) be added to the oxide semiconductor or excess oxygen be supplied to fill the oxygen vacancies in the oxide semiconductor film 106. In this specification and the like, supplying oxygen to the oxide semiconductor film 106 may be expressed as oxygen adding treatment or treatment for adding excess oxygen.

Note that the case is described where dehydration treatment (dehydrogenation treatment) and oxygen adding treatment are performed after the oxide semiconductor film 106 is processed to have an island shape; however, an embodiment of the disclosed invention is not construed as being limited to the case. Such treatments may be performed before the oxide semiconductor film 106 is processed to have an island shape. Alternatively, after the interlayer insulating film 112 is formed, heat treatment may be performed so that oxygen is supplied from the base insulating film 104, the gate insulating film 108, or the like to the oxide semiconductor film 106.

In this manner, hydrogen or moisture is removed from the oxide semiconductor film 106 by dehydration treatment (dehydrogenation treatment) and oxygen vacancies therein are filled by oxygen adding treatment, whereby the oxide semiconductor film 106 can be turned into an i-type (intrinsic) or substantially i-type oxide semiconductor film. The oxide semiconductor film 106 formed in such a manner includes extremely few (close to zero) carriers derived from a donor, and the carrier concentration thereof is lower than $1\times10^{14}/cm^3$, preferably lower than $1\times10^{12}/cm^3$, further preferably lower than $1\times10^{11}/cm^3$.

Next, a gate insulating film 108 is formed over the oxide semiconductor film 106 (see FIG. 2A). The gate insulating film 108 can have a thickness of greater than or equal to 1 nm and less than or equal to 500 nm, for example. There is no particular limitation on a method for forming the gate insulating film 108; for example, a sputtering method, an MBE method, a CVD method, a pulse laser deposition method, an ALD method, or the like can be used as appropriate.

The gate insulating film 108 can be formed using silicon oxide, gallium oxide, aluminum oxide, silicon nitride, silicon oxynitride, aluminum oxynitride, silicon nitride oxide, or the like. A portion of the gate insulating film 108, which is in contact with the oxide semiconductor film 106, preferably contains oxygen. In particular, the gate insulating film 108 preferably contains oxygen at an amount which exceeds at least the stoichiometric composition. For example, in the case where a silicon oxide film is used as the gate insulating film 108, a film of $SiO_{2+\alpha}$ ($\alpha>0$) is preferably used. In this embodiment, a silicon oxide film of $SiO_{2+\alpha}$ ($\alpha>0$) is used as the gate insulating film 108. With the use of the silicon oxide film as the gate insulating film 108, oxygen can be supplied to the oxide semiconductor film 106 from the gate insulating film 108 as well as from the base insulating film 104 and favorable electric characteristics can be obtained.

The gate insulating film 108 can be formed using a high-k material such as hafnium oxide, yttrium oxide, hafnium silicate ($HfSi_xO_y$ ($x>0$, $y>0$)), hafnium silicate to which nitrogen is added ($HfSiO_xN_y$ ($x>0$, $y>0$)), hafnium aluminate ($HfAl_xO_y$ ($x>0$, $y>0$)), or lanthanum oxide. By using such a material, gate leakage current can be reduced. Further, the gate insulating film 108 may have a single-layer structure or a stacked-layer structure.

Next, a conductive film to be a gate electrode (including a wiring formed using the same layer as the gate electrode) is formed over the gate insulating film 108. The conductive film to be a gate electrode can be formed using a metal material such as molybdenum, titanium, tantalum, tungsten, aluminum, copper, neodymium, or scandium; or an alloy material including any of these materials as its main component, for example. Alternatively, the conductive film to be a gate electrode may be formed using a conductive metal oxide. As the conductive metal oxide, indium oxide ($In_2O_3$), tin oxide ($SnO_2$), zinc oxide (ZnO), indium tin oxide ($In_2O_3$—$SnO_2$, which is abbreviated to ITO in some cases), indium zinc oxide ($In_2O_3$—ZnO), or any of these metal oxide materials in which silicon or silicon oxide is included can be used. The conductive film to be a gate electrode can be formed to have a single layer or a stacked structure using any of the above materials. There is no particular limitation on the formation method, and a variety of film formation methods such as an evaporation method, a CVD method, a sputtering method, or a spin coating method can be employed.

Next, a resist mask is formed over the conductive film in a photolithography step, and selective etching is performed; thus, the gate electrode 110 is formed. After that, the resist mask is removed (see FIG. 2B).

Note that, as the resist mask for forming the gate electrode 110, a resist mask which is formed by a photolithography method or the like and subjected to a slimming process to have a finer pattern is preferably used. As the slimming process, an ashing process in which oxygen in a radical state (an oxygen radical) or the like is used can be employed, for example.

The resist mask used for forming the gate electrode 110 may be formed by an inkjet method. Formation of the resist mask by an inkjet method needs no photomask; thus, manufacturing cost can be reduced. The gate electrode 110 may be etched by either dry etching or wet etching, or by both of them.

Figure 2C:
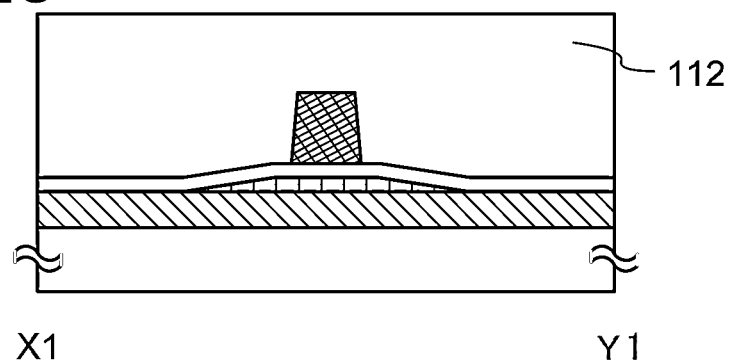

Next, the interlayer insulating film 112 is formed over the gate insulating film 108 and the gate electrode 110 (see FIG. 2C).

The interlayer insulating film 112 is preferably formed using an inorganic insulating film and may be formed as a single layer or a stacked layer of any of oxide insulating films such as a silicon oxide film, a silicon oxynitride film, an aluminum oxide film, an aluminum oxynitride film, a gallium oxide film, and a hafnium oxide film. Further, over the above oxide insulating film, a single layer or a stacked layer of any of nitride insulating films such as a silicon nitride film, a silicon nitride oxide film, an aluminum nitride film, and an aluminum nitride oxide film may be formed. For example, by a sputtering method, a silicon oxide film and an aluminum oxide film are stacked from the gate electrode 110 side.

A planarization insulating film may be formed over the interlayer insulating film 112. For the planarization insulating film, a heat-resistant organic material such as an acrylic-based resin, a polyimide-based resin, a benzocyclobutene-based resin, a polyamide-based resin, or an epoxy-based resin can be used. Other than such organic materials, a low-dielectric constant material (a low-k material), a siloxane-based resin, or the like can be used. Note that the planarization insulating film may be formed by stacking a plurality of insulating films formed of any of these materials.

Figure 2D:
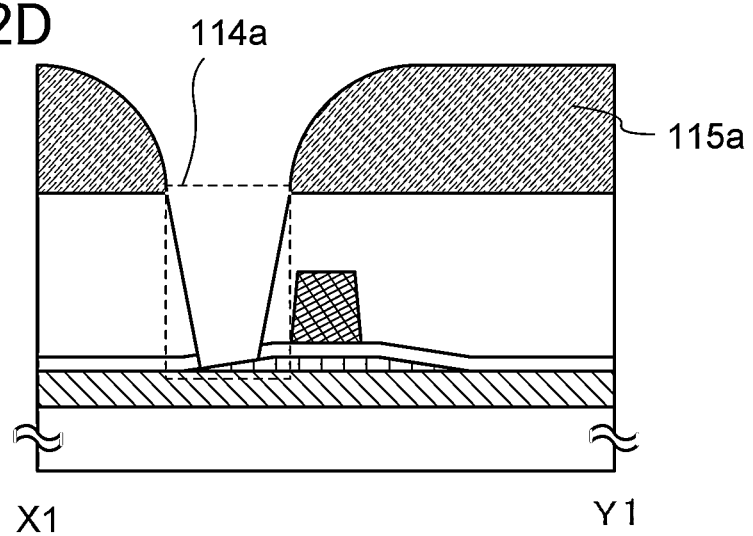

Next, a mask 115a is formed over the interlayer insulating film 112, and the interlayer insulating film 112 and the gate insulating film 108 are etched with the use of the mask 115a, so that an opening 114a which reaches the oxide semiconductor film 106 is formed (see FIG. 2D).

The mask 115a can be formed by a photolithography method or the like using a material such as a photoresist. For light exposure at the time of forming the mask 115a, extreme ultraviolet light having a wavelength as short as several nanometers to several tens of nanometers is preferably used. In the light exposure by extreme ultraviolet light, the resolution is high and the focus depth is large. Thus, the mask 115a having a fine pattern can be formed.

As long as it is possible to form the mask 115a having a sufficiently fine pattern, a different method such as an ink-jet method may be used to form the mask 115a. In this case, it is unnecessary to use a photosensitive material such as a photoresist as a material of the mask 115a.

After the mask 115a is removed, a mask 115b is formed in and over the opening 114a and over the interlayer insulating film 112. The mask 115b can be formed in a manner similar to the mask 115a. Then, the interlayer insulating film 112 and the gate insulating film 108 are etched with the use of the mask 115b, so that an opening 114b which reaches the oxide semiconductor film 106 is formed (see FIG. 3A). Thus, a pair of openings with the gate electrode 110 sandwiched therebetween is formed in the gate insulating film 108 and the interlayer insulating film 112.

Figure 3A:
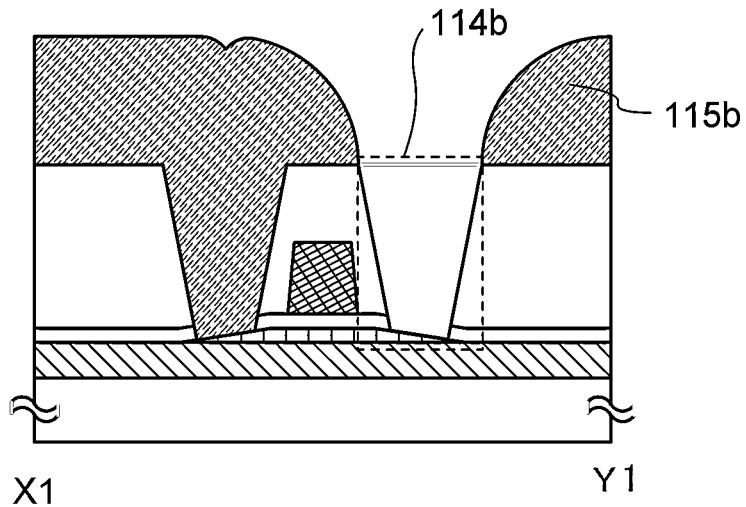
FIGS. 3A to 3C are cross-sectional views illustrating the example of the manufacturing process of the semiconductor device.
Figure 3B:
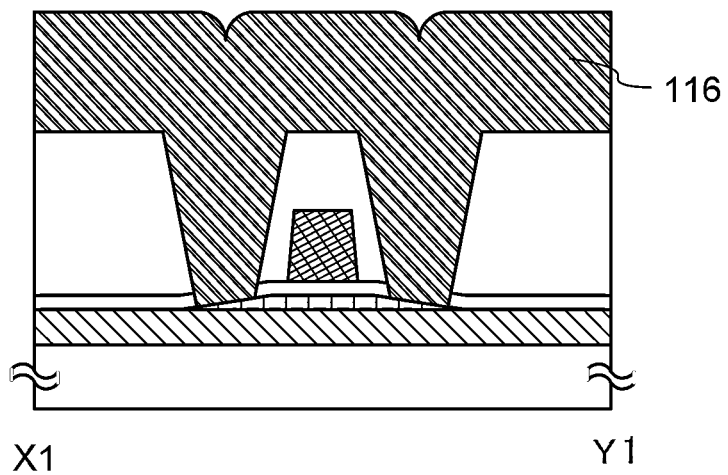

Next, a conductive film 116 which is to be a source electrode and a drain electrode is formed over the interlayer insulating film 112 to fill the opening 114a and the opening 114b (see FIG. 3B).

The conductive film 116 is formed of a material that can withstand heat treatment performed later. For example, a metal film containing an element selected from Al, Cr, Cu, Ta, Ti, Mo, and W, or a metal nitride film containing any of the above elements as a component (a titanium nitride film, a molybdenum nitride film, or a tungsten nitride film) can be used. A metal film having a high melting point of Ti, Mo, W, or the like or a metal nitride film of any of these elements (a titanium nitride film, a molybdenum nitride film, or a tungsten nitride film) may be stacked on one of or both a lower side and an upper side of a metal film of Al, Cu, or the like.

Further, the conductive layer film 116 used for the source electrode and the drain electrode may be formed using a conductive metal oxide. Examples of the conductive metal oxide are indium oxide ($In_2O_3$), tin oxide ($SnO_2$), zinc oxide (ZnO), a mixed oxide of indium oxide and tin oxide ($In_2O_3$—$SnO_2$, referred to as ITO), a mixed oxide of indium oxide and zinc oxide ($In_2O_3$—ZnO), and any of these metal oxide materials containing silicon oxide.

Figure 3C:
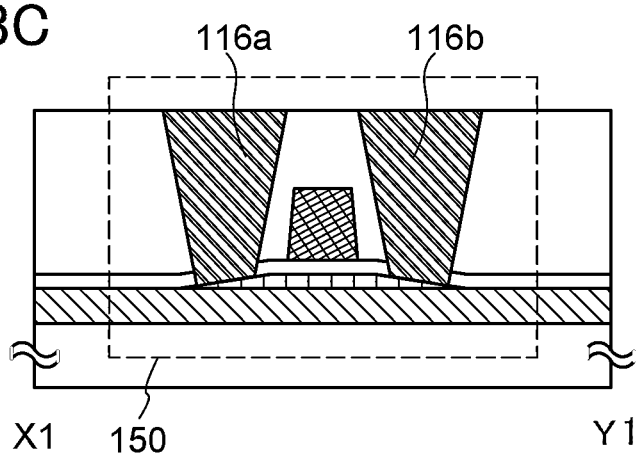

Next, a CMP (chemical mechanical polishing) treatment is performed on the conductive film 116 (see FIG. 3C). The CMP treatment is performed on the conductive film 116 in order to remove the conductive film 116 provided over the interlayer insulating film 112 (at least a region with which the gate electrode 110 overlaps), whereby the source electrode 116a and the drain electrode 116b embedded in the opening 114a and the opening 114b can be formed. In this embodiment, through the CMP treatment performed on the conductive film 116 under such conditions that the surface of the interlayer insulating film 112 is exposed, the source electrode 116a and the drain electrode 116b are formed. Note that the surface of the interlayer insulating film 112 or the surface of the gate electrode 110 may also be polished depending on conditions of the CMP treatment. At this stage, the transistor 150 is formed.

At least part of the source electrode 116a and the drain electrode 116b is in contact with the side surfaces of the oxide semiconductor film 106. The side surface of the oxide semiconductor film 106 has a taper angle greater than or equal to 1° and less than 10°, so that the contact region of the oxide semiconductor film 106 and the source electrode 116a or the drain electrode 116b can be increased. Further, the source electrode 116a and the drain electrode 116b can be in contact with the oxide semiconductor film 106 without disconnection. Furthermore, the side surface of the oxide semiconductor film 106 can be used as a contact region, whereby the area of the oxide semiconductor film 106 can be reduced when an intended area of the contact region is required.

Further, the CMP process is a method for planarizing a surface of an object with a combination of chemical and mechanical actions. More specifically, the CMP treatment is a method in which a polishing cloth is attached to a polishing stage, the polishing stage and an object to be processed are each rotated or swung while a slurry (an abrasive) is supplied between the object to be processed and the polishing cloth, and the surface of the object to be processed is polished by a chemical reaction between the slurry and the surface of the object to be processed and by a mechanical polishing action of the polishing cloth on the object to be processed.

Note that the CMP treatment may be performed only once or plural times. When the CMP treatment is performed plural times, first polishing is preferably performed with a high polishing rate followed by final polishing with a low polishing rate. By performing polishing at different polishing rates, the planarity of the surfaces of the source electrode 116a, the drain electrode 116b, and the interlayer insulating film 112 can be further improved.

Note that in this embodiment, the CMP treatment is used for removing the conductive film 116 in the region with which the interlayer insulating film 112 is overlapped; however, another polishing (grinding or cutting) treatment may be used. Alternatively, the polishing treatment such as the CMP treatment may be combined with etching (dry etching or wet etching) treatment or plasma treatment. For example, after the CMP treatment, dry etching treatment or plasma treatment (reverse sputtering or the like) may be performed to improve the planarity of the surface to be processed. In the case where the polishing treatment is combined with etching treatment, plasma treatment or the like, the order of the steps is not particularly limited, and may be set as appropriate depending on the material, thickness, and roughness of the surface of the conductive film 116.

In this embodiment, although the opening 114a and the opening 114b are provided in two steps, the method is not limited thereto, and a forming method by one step may be used. However, there is a resolution limit of a light-exposure apparatus used for forming a mask and the size of an opening is limited; therefore, in order to reduce a distance between the opening 114a and the opening 114b sufficiently, it is preferable that the openings 114a and 114b be separately formed in two steps as described in this embodiment. Such a method enables miniaturization of the transistor.

Further, to reduce a distance between the opening 114a and the opening 114b means, in other words, reducing a distance between the source electrode 116a and the drain electrode 116b which are to be formed later. That is, the distance between the source electrode 116a and the drain electrode 116b can be reduced to, for example, greater than or equal to 0.05 μm and less than or equal to 0.1 μm. By reducing the distance between the source electrode 116a and the drain electrode 116b, the resistance between the source and the drain can be reduced, so that electrical characteristics (e.g., on-state current characteristics) of the transistor 150 can be improved.

Figure 4:
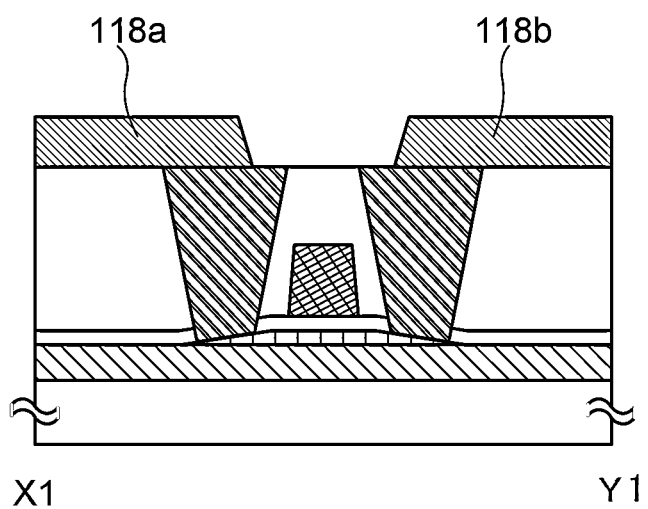
FIG. 4 is a cross-sectional view illustrating the example of the manufacturing process of the semiconductor device.

Next, a conductive film is formed over the interlayer insulating film 112, the source electrode 116a, and the drain electrode 116b, and a wiring 118a and a wiring 118b are formed through a photolithography step and an etching step (see FIG. 4).

The wirings 118a and 118b can be formed using a material and a method similar to those of the gate electrode 110 or the source electrode 116a and the drain electrode 116b. For example, as the wiring 118a and the wiring 118b, a stack of a tantalum nitride film and a copper film or a stack of a tantalum nitride film and a tungsten film can be used.

Through the above process, the transistor 150 in this embodiment is formed.

In the semiconductor device described in this embodiment, the side surface of the oxide semiconductor film has a taper angle greater than or equal to 1° and less than 10°, and at least part of the source electrode and the drain electrode is in contact with the side surfaces of the oxide semiconductor film. With such a structure, the contact region can be increased. Further, the source electrode and the drain electrode can be in contact with the oxide semiconductor film without disconnection. Furthermore, the side surface of the oxide semiconductor film can be used as a contact region, whereby the area of the oxide semiconductor film can be reduced when an intended area of the contact region is required. Therefore, the size of the transistor can be sufficiently reduced.

By sufficiently reducing the size of the transistor, an area of a semiconductor device is decreased, and the number of semiconductor devices manufactured with one substrate is increased. Thus, the manufacturing cost per semiconductor device can be saved. In other words, miniaturization of a transistor including an oxide semiconductor is achieved according to one embodiment of the disclosed invention, and therefore a variety of advantageous effects accompanying the miniaturization can be obtained.

The methods and structures described in this embodiment can be combined as appropriate with any of the methods and structures described in the other embodiments.

(Embodiment 2)

In this embodiment, modification examples of the semiconductor device and the method for manufacturing the semiconductor device of Embodiment 1, which are illustrated in FIGS. 1A to 1C, FIGS. 2A to 2D, FIGS. 3A to 3C, and FIG. 4 will be described with reference to FIGS. 5A to 5C, FIGS. 6A to 6D, FIGS. 7A to 7C, and FIGS. 8A and 8B. Note that portions similar to those in FIGS. 1A to 1C, FIGS. 2A to 2D, FIGS. 3A to 3C, and FIG. 4 are denoted by the same reference numerals, and description thereof is skipped.

<Structural Example of Semiconductor Device (Modification Example)>

Figure 5A:
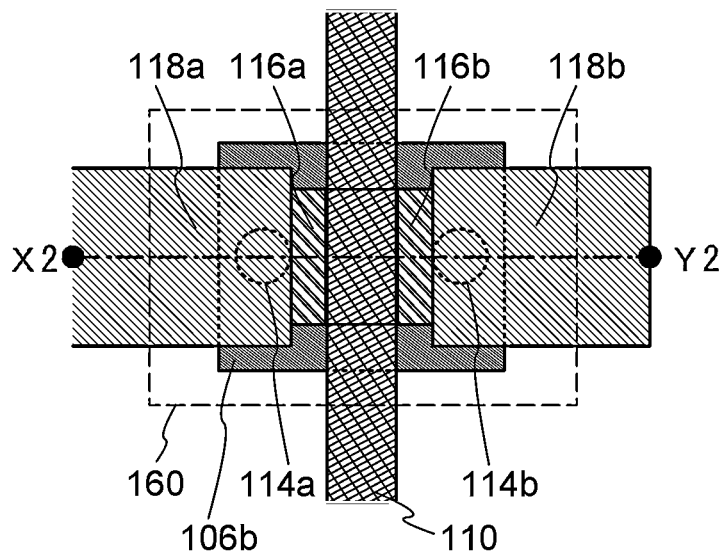
FIGS. 5A to 5C are a plan view and cross-sectional views illustrating an embodiment of a semiconductor device.
Figure 5B:
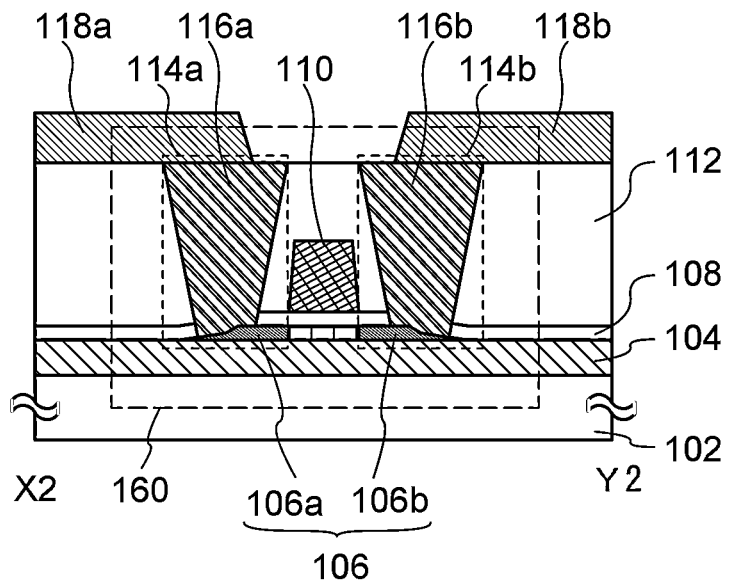
Figure 5C:
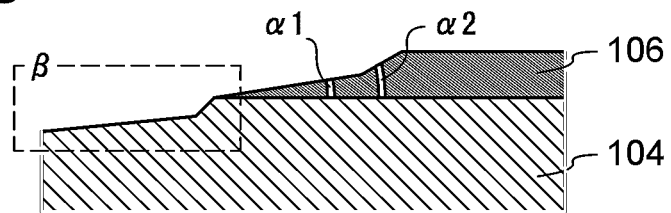

As an example of a semiconductor device, a plan view and cross-sectional views of a top-gate transistor are illustrated in FIGS. 5A, 5B, and 5C. Note that FIG. 5A shows a plan view and FIG. 5B is a cross-sectional view taken along dashed line X2-Y2 in FIG. 5A. Further, FIG. 5C is a cross-sectional view of part of a base insulating film 104 and an oxide semiconductor film 106 illustrated in FIG. 5B which is enlarged. Note that in FIG. 5A, some components of a transistor 160 (e.g., a gate insulating film 108 or the like) are not illustrated for simplification.

The transistor 160 illustrated in FIGS. 5A and 5B includes a base insulating film 104 formed over a substrate 102, an oxide semiconductor film 106 including a low-resistance region 106a and a low-resistance region 106b and formed over the base insulating film 104, a gate insulating film 108 formed over the oxide semiconductor film 106, a gate electrode 110 formed in contact with the gate insulating film 108 and provided at a position overlapping with the oxide semiconductor film 106, an interlayer insulating film 112 formed over the gate insulating film 108 and the gate electrode 110, an opening 114a and an opening 114b provided in the gate insulating film 108 and the interlayer insulating film 112, and a source electrode 116a and a drain electrode 116b provided to fill the opening 114a and the opening 114b. Moreover, the transistor 160 may include a wiring 118a and a wiring 118b connected to the source electrode 116a and the drain electrode 116b.

Further, the oxide semiconductor film 106 includes a channel formation region, and the channel formation region includes a pair of low-resistance regions 106a and 106b. The low-resistance region 106a and the low-resistance region 106b are connected to the source electrode 116a and the drain electrode 116b, respectively. In this manner, the low-resistance region 106a and the low-resistance region 106b are provided in the oxide semiconductor film 106, whereby the contact resistance between the oxide semiconductor film 106 and the source electrode 116a or the drain electrode 116b can be reduced.

As illustrated in FIGS. 5B and 5C, the oxide semiconductor film 106 has two taper angles at the side surface, and one of the two taper angles has a structure including a taper angle greater than or equal to 1° and less than 10°. In FIG. 5C, portions represented by α1 and α2 are the taper angles, α1 is a taper angle greater than or equal to 1° and less than 10°, and α2 is a taper angle greater than or equal to 10°. However, α2 may also be a taper angle greater than or equal to 1° and less than 10°.

In this manner, in this embodiment, although a structure in which a side surface has two taper angles is described, a structure is not particularly limited thereto. The side surface may have two or more taper angles.

The oxide semiconductor film 106 can be formed by etching an oxide semiconductor film by a dry etching method. Further, in this embodiment, as an etching gas, $BCl_3$, $Cl_2$, and $O_2$, are used, whereby the taper angle is greater than or equal to 1° and less than 10° at the side surface. Further, a dry etching apparatus using a high-density plasma source such as ECR or ICP can be used to improve an etching rate.

Note that, as illustrated in a region represented by β of FIG. 5C, the base insulating film 104 is also etched and partially becomes thin depending on etching conditions. Note that the base insulating film 104 can be prevented from being thin by adjusting the etching conditions or changing the etching apparatus. By adjusting the etching conditions, one of the taper angles α1 and α2 of the oxide semiconductor film 106 can be greater than or equal to 1° and less than 10°. Further, by adjusting the etching conditions or changing an etching apparatus, a step-like side surface including a plurality of taper angles can be provided.

The thickness of the oxide semiconductor film 106 is greater than 5 nm and less than or equal to 200 nm, preferably greater than or equal to 10 nm and less than or equal to 30 nm, more preferably greater than or equal to 10 nm and less than or equal to 20 nm. Further, the oxide semiconductor film 106 preferably has a structure with crystallinity, such as a single crystal structure, a polycrystalline structure, or a microcrystalline structure.

In this embodiment, the oxide semiconductor film 106 is preferably a CAAC-OS film.

The source electrode 116a and the drain electrode 116b are at least partly in contact with the side surfaces each including a taper angle greater than or equal to 1° and less than 10° of the oxide semiconductor film 106.

With such a structure, a contact region of the oxide semiconductor film 106 and the source electrode 116a or the drain electrode 116b can be increased. Further, the source electrode 116a and the drain electrode 116b can be in contact with the oxide semiconductor film 106 without disconnection. Furthermore, the side surface of the oxide semiconductor film 106 can be used as a contact region, whereby the area of the oxide semiconductor film 106 can be reduced when an intended area of the contact region is required.

Further, in this embodiment, the low-resistance region 106a and the low-resistance region 106b are provided in the oxide semiconductor film 106. With such a structure, the low-resistance region 106a and the low-resistance region 106b in the oxide semiconductor film 106 are in contact with the source electrode 116a and the drain electrode 116b, respectively, whereby contact resistance can be reduced.

In this manner, the area of the oxide semiconductor film 106 is reduced and the contact areas of the oxide semiconductor film 106 and the source electrode 116a or the drain electrodes 116b are increased, whereby the size of the transistor 160 can be sufficiently reduced with favorable electrical characteristics maintained.

Therefore, by sufficiently reducing the size of the transistor, an area of a semiconductor device is decreased, and the number of semiconductor devices manufactured with one substrate is increased. Thus, the manufacturing cost per semiconductor device is saved. Further, the size of the transistor is sufficiently reduced, whereby new function or the like can be added using a space formed by the reduction in a semiconductor device and a function of the semiconductor device can be further improved compared to that of the semiconductor device which is substantially the same size as the former semiconductor device. In other words, miniaturization of a transistor including an oxide semiconductor is achieved according to one embodiment of the disclosed invention, and therefore a variety of advantageous effects accompanying the miniaturization can be obtained.

Note that the details of the other components of the transistor are described in description of a method for manufacturing the transistor 160 below, with reference to FIGS. 6A to 6D, FIGS. 7A to 7C, and FIGS. 8A and 8B.

<Method for Manufacturing Transistor 160>

An example of a method for manufacturing the transistor 160 illustrated in FIGS. 5A to 5C of this embodiment is described below with reference to FIGS. 6A to 6D, FIGS. 7A to 7C, and FIGS. 8A and 8B.

First, the substrate 102 is prepared. A substrate having a structure similar to that described in Embodiment 1 can be used as the substrate 102.

Figure 6A:
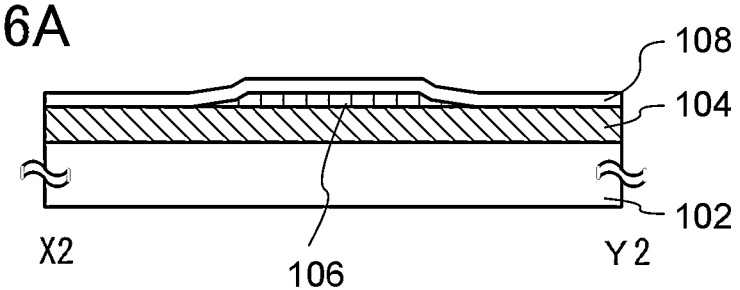
FIGS. 6A to 6D are cross-sectional views illustrating an example of a manufacturing process of the semiconductor device.
Figure 6B:
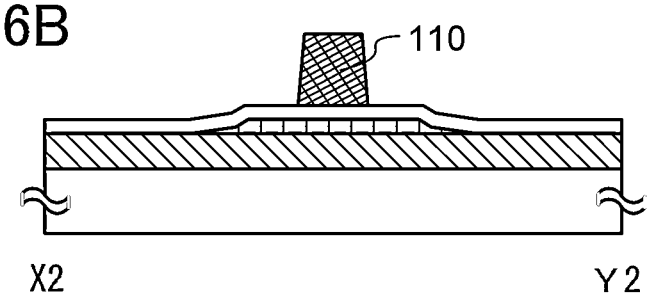

Next, the base insulating film 104 is formed over the substrate 102 (see FIG. 6A). The base insulating film 104 can have a structure similar to that described in Embodiment 1.

The substrate 102 may be subjected to plasma treatment or the like before the base insulating film 104 is formed. As plasma treatment, reverse sputtering in which an argon gas is introduced and plasma is generated can be performed, for example. The reverse sputtering is a method in which voltage is applied to the substrate 102 side with the use of an RF power source in an argon atmosphere and plasma is generated in the vicinity of the substrate 102 so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface of the substrate 102.

Next, an oxide semiconductor film is formed over the base insulating film 104 and a photolithography step and an etching step are performed. Thus, the oxide semiconductor film 106 is formed (see FIG. 6A). The oxide semiconductor film 106 is preferably a CAAC-OS film. Note that the base insulating film 104 and the oxide semiconductor film 106 are preferably formed successively without exposure to the air.

The material which can be used for the oxide semiconductor film 106, the method for forming the oxide semiconductor film 106, and the like can have a structure similar to that described in Embodiment 1.

In this embodiment, as a method for forming the oxide semiconductor film 106, the oxide semiconductor film is etched by a dry etching method. As an etching gas, $BCl_3$, $Cl_2$, $O_2$, and the like can be used. A dry etching apparatus using a high-density plasma source such as ECR or ICP can be used to improve an etching rate.

In this embodiment, with the use of an ICP etching apparatus and by appropriately adjusting the etching conditions (e.g., the amount of power applied to a coil-shaped electrode, the amount of power applied to an electrode on a substrate side, the electrode temperature on the substrate side, or the like), the oxide semiconductor film can be etched into a desired island shape. For example, the conditions for dry-etching the 20-nm-thick In—Ga—Zn—O film to be the oxide semiconductor film 106 are as follows: the amount of power applied to a coil-shaped electrode is 450 W; the amount of bias power applied to an electrode on the substrate 102 side is 100 W (RF); the flow rates of a $BCl_3$ gas, a $Cl_2$ gas, and an $O_2$ gas introduced into the etching apparatus are 60 sccm, 20 sccm, and 10 sccm, respectively; the pressure is 1.9 Pa; and the substrate temperature is 70° C.

Note that the base insulating film 104 is also etched and partially becomes thin depending on etching conditions. Note that it is possible not to make the base insulating film 104 thin by adjusting the etching conditions or changing the etching apparatus. In this manner, by adjusting the etching conditions, the taper angle at the side surface of the oxide semiconductor film 106 can be greater than or equal to 1° and less than 10°.

In this embodiment, the side surface of the oxide semiconductor film 106 has two taper angles. In this way, the side surface of the oxide semiconductor film 106 may have a plurality of taper angles. The plurality of taper angles can be formed by adjusting the etching conditions or an etching apparatus.

In addition, after the oxide semiconductor film 106 is formed, the oxide semiconductor film 106 may be subjected to dehydration treatment (dehydrogenation treatment) and oxygen adding treatment. Dehydration treatment (dehydrogenation treatment) and oxygen adding treatment can be performed in a similar manner to those described in Embodiment 1.

Then, the gate insulating film 108 is formed over the oxide semiconductor film 106 (see FIG. 6A). The gate insulating film 108 can have a structure similar to that described in Embodiment 1.

Next, a conductive film to be a gate electrode (including a wiring formed using the same layer as the gate electrode) is formed over the gate insulating film 108. The conductive film to be a gate electrode can be formed using a metal material such as molybdenum, titanium, tantalum, tungsten, aluminum, copper, neodymium, or scandium; or an alloy material including any of these materials as its main component, for example. Alternatively, the conductive film to be a gate electrode may be formed using a conductive metal oxide. As the conductive metal oxide, indium oxide ($In_2O_3$), tin oxide ($SnO_2$), zinc oxide (ZnO), indium tin oxide ($In_2O_3$—$SnO_2$, which is abbreviated to ITO in some cases), indium zinc oxide ($In_2O_3$—ZnO), or any of these metal oxide materials in which silicon or silicon oxide is included can be used. The conductive film to be a gate electrode can be formed to have a single layer or a stacked structure using any of the above materials. There is no particular limitation on the formation method, and a variety of film formation methods such as an evaporation method, a CVD method, a sputtering method, or a spin coating method can be employed.

Next, a resist mask is formed over the conductive film in a photolithography step, and selective etching is performed; thus, the gate electrode 110 is formed. After that, the resist mask is removed (see FIG. 6B).

Note that, as the resist mask for forming the gate electrode 110, a resist mask which is formed by a photolithography method or the like and subjected to a slimming process to have a finer pattern is preferably used. As the slimming process, an ashing process in which oxygen in a radical state (an oxygen radical) or the like is used can be employed, for example.

The resist mask used for forming the gate electrode 110 may be formed by an inkjet method. Formation of the resist mask by an inkjet method needs no photomask; thus, manufacturing cost can be reduced. The gate electrode 110 may be etched by either dry etching or wet etching, or by both of them.

Figure 6C:
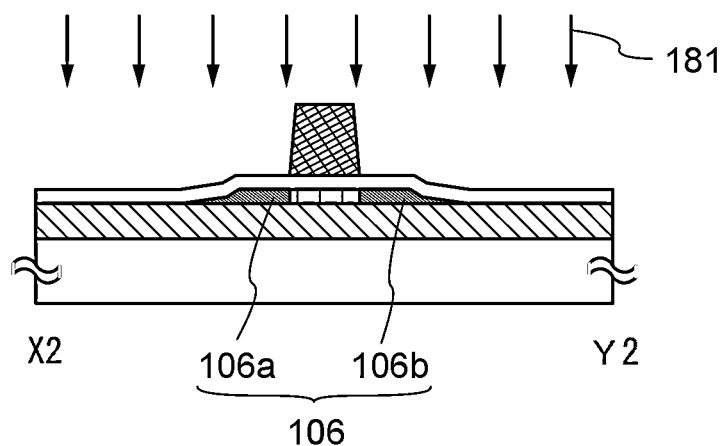

Next, a dopant 181 is introduced to the oxide semiconductor film 106 using the gate electrode 110 as a mask, whereby the pair of low-resistance regions 106a and 106b are formed (see FIG. 6C).

The dopant 181 is an impurity by which the electrical conductivity of the oxide semiconductor film 106 is changed. One or more selected from the following can be used as the dopant 181: Group 15 elements (typical examples thereof are phosphorus (P), arsenic (As), and antimony (Sb)), boron (B), aluminum (Al), nitrogen (N), argon (Ar), helium (He), neon (Ne), indium (In), fluorine (F), chlorine (Cl), titanium (Ti), and zinc (Zn).

The dopant 181 can be introduced to the oxide semiconductor film 106 through another film (e.g., the gate insulating film 108) by selecting an appropriate method for introducing the dopant. As the method for introducing the dopant 181, an ion implantation method, an ion doping method, a plasma immersion ion implantation method, or the like can be used. In that case, it is preferable to use a single ion of the dopant 181, or a fluoride ion or a chloride ion thereof.

The introduction of the dopant 181 may be controlled by setting the addition conditions such as the accelerated voltage and the dosage, or the thickness of the film through which the dopant passes as appropriate. In this embodiment, phosphorus is used as the dopant 181, whose ion is added by an ion implantation method. The dosage of the dopant 181 is preferably set to be greater than or equal to $1\times10^{13}$ ions/cm$^2$ and less than or equal to $5\times10^{16}$ ions/cm$^2$.

The concentration of the dopant 181 in the low-resistance regions 106a and 106b is preferably higher than or equal to $5\times10^{18}$/cm$^3$ and lower than or equal to $1\times10^{22}$/cm$^3$.

The dopant 181 may be introduced with the substrate 102 heated.

The introduction of the dopant 181 into the oxide semiconductor film 106 may be performed plural times, and the number of kinds of dopant may be plural.

Further, heat treatment may be performed thereon after the introduction of the dopant 181. The heat treatment is preferably performed at a temperature higher than or equal to 300° C. and lower than or equal to 700° C., more preferably higher than or equal to 300° C. and lower than or equal to 450° C., for one hour under an oxygen atmosphere. The heat treatment may be performed under a nitrogen atmosphere, reduced pressure, or the air (ultra-dry air).

In the case where the oxide semiconductor film 106 is a crystalline oxide semiconductor film or a CAAC-OS film, part of the oxide semiconductor film 106 becomes amorphous due to the introduction of the dopant 181 in some cases. In that case, the crystallinity of the oxide semiconductor film 106 can be recovered by performing heat treatment thereon after the introduction of the dopant 181.

In this manner, in the oxide semiconductor film 106, the low-resistance region 106a and the low-resistance region 106b are provided in a self-aligned manner with the channel formation region provided therebetween.

Figure 6D:
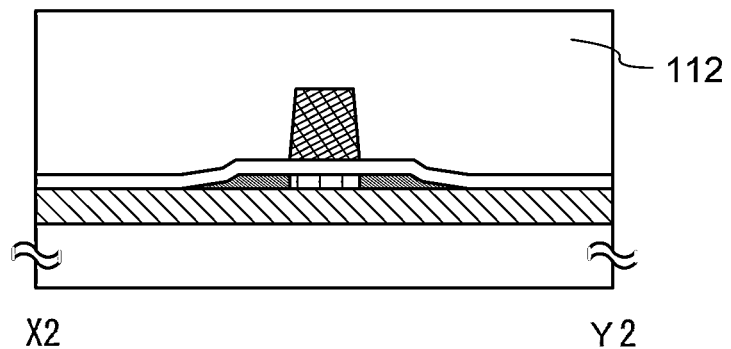

Next, the interlayer insulating film 112 is formed over the gate insulating film 108 and the gate electrode 110 (see FIG. 6D). The interlayer insulating film 112 can have a structure similar to that described in Embodiment 1.

A planarization insulating film may be formed over the interlayer insulating film 112. For the planarization insulating film, a heat-resistant organic material such as an acrylic-based resin, a polyimide-based resin, a benzocyclobutene-based resin, a polyamide-based resin, or an epoxy-based resin can be used. Other than such organic materials, a low-dielectric constant material (a low-k material), a siloxane-based resin, or the like can be used. Note that the planarization insulating film may be formed by stacking a plurality of insulating films formed of any of these materials.

Figure 7A:
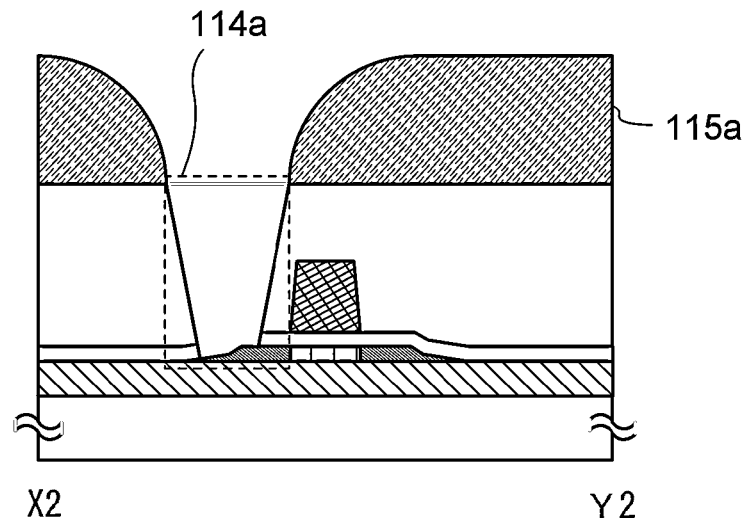
FIGS. 7A to 7C are cross-sectional views illustrating the example of the manufacturing process of the semiconductor device.
Figure 7B:
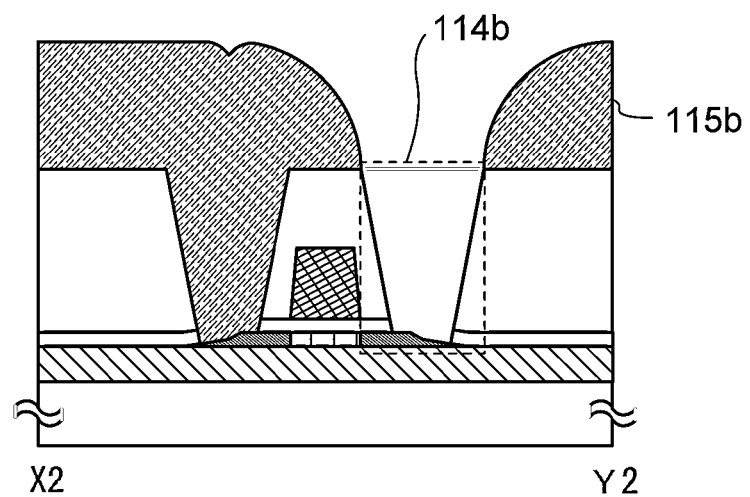

Next, a mask 115a is formed over the interlayer insulating film 112, and the interlayer insulating film 112 and the gate insulating film 108 are etched with the use of the mask 115a, so that an opening 114a which reaches the low-resistance region 106a provided in the oxide semiconductor film 106 is formed (see FIG. 7A).

The mask 115a can be formed by a photolithography method or the like using a material such as a photoresist. For light exposure at the time of forming the mask 115a, extreme ultraviolet light having a wavelength as short as several nanometers to several tens of nanometers is preferably used. In the light exposure by extreme ultraviolet light, the resolution is high and the focus depth is large. Thus, the mask 115a having a fine pattern can be formed.

As long as it is possible to form the mask 115a having a sufficiently fine pattern, a different method such as an ink-jet method may be used to form the mask 115a. In this case, it is unnecessary to use a photosensitive material such as a photoresist as a material of the mask 115a.

After the mask 115a is removed, a mask 115b is formed in and over the opening 114a and over the interlayer insulating film 112. The mask 115b can be formed in a manner similar to the mask 115a. Then, the interlayer insulating film 112 and the gate insulating film 108 are etched with the use of the mask 115b, so that an opening 114b which reaches the low-resistance region 106b provided in the oxide semiconductor film 106 is formed (see FIG. 7B). Thus, a pair of openings with the gate electrode 110 sandwiched therebetween is formed in the gate insulating film 108 and the interlayer insulating film 112.

Figure 7C:
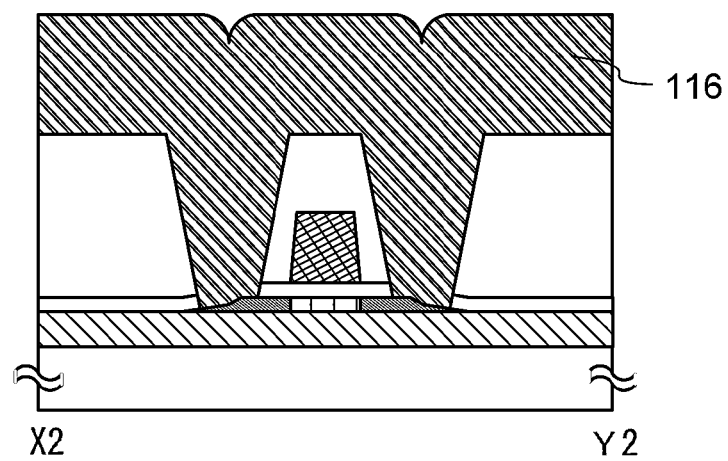

Next, a conductive film 116 which is to be a source electrode and a drain electrode is formed over the interlayer insulating layer 112 to fill the opening 114a and the opening 114b (see FIG. 7C).

The conductive film 116 is formed of a material that can withstand heat treatment performed later. For example, a metal film containing an element selected from Al, Cr, Cu, Ta, Ti, Mo, and W, or a metal nitride film containing any of the above elements as a component (a titanium nitride film, a molybdenum nitride film, or a tungsten nitride film) can be used. A metal film having a high melting point of Ti, Mo, W, or the like or a metal nitride film of any of these elements (a titanium nitride film, a molybdenum nitride film, or a tungsten nitride film) may be stacked on one of or both a lower side and an upper side of a metal film of Al, Cu, or the like.

Further, the conductive layer film 116 used for the source electrode and the drain electrode may be formed using a conductive metal oxide. Examples of the conductive metal oxide are indium oxide ($In_2O_3$), tin oxide ($SnO_2$), zinc oxide (ZnO), a mixed oxide of indium oxide and tin oxide ($In_2O_3$—$SnO_2$, referred to as ITO), a mixed oxide of indium oxide and zinc oxide ($In_2O_3$—ZnO), and any of these metal oxide materials containing silicon oxide.

Figure 8A:
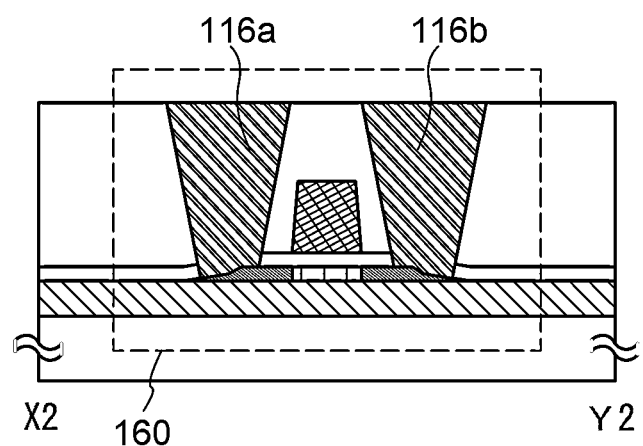
FIGS. 8A and 8B are cross-sectional views illustrating the example of the manufacturing process of the semiconductor device.

Next, a CMP treatment is performed on the conductive film 116 in order to remove the conductive film 116 provided over the interlayer insulating film 112 (at least a region with which the gate electrode 110 overlaps), whereby the source electrode 116a and the drain electrode 116b embedded in the opening 114a and the opening 114b are formed (see FIG. 8A).

In this embodiment, through the CMP treatment performed on the conductive film 116 under such conditions that the surface of the interlayer insulating film 112 is exposed, the source electrode 116a and the drain electrode 116b are formed. Note that the surface of the interlayer insulating film 112 or the surface of the gate electrode 110 may also be polished depending on conditions of the CMP treatment. At this stage, the transistor 160 is formed.

At least part of the source electrode 116a and the drain electrode 116b is in contact with the side surfaces of the oxide semiconductor film 106. The side surface of the oxide semiconductor film 106 has a taper angle greater than or equal to 1° and less than 10°, so that the contact region of the oxide semiconductor film 106 and the source electrode 116a or the drain electrode 116b can be increased. Further, the source electrode 116a and the drain electrode 116b can be in contact with the oxide semiconductor film 106 without disconnection. Furthermore, the side surface of the oxide semiconductor film 106 can be used as a contact region, whereby the area of the oxide semiconductor film 106 can be reduced when an intended area of the contact region is required.

Note that the CMP treatment can have a structure similar to that described in Embodiment 1.

In this embodiment, although the opening 114a and the opening 114b are provided in two steps, the method is not limited thereto, and a forming method by one step may be used. However, there is a resolution limit of a light-exposure apparatus used for forming a mask and the size of an opening is limited; therefore, in order to reduce a distance between the opening 114a and the opening 114b sufficiently, it is preferable that the openings 114a and 114b be separately formed in two steps as described in this embodiment. Such a method enables miniaturization of the transistor.

Further, to reduce a distance between the opening 114a and the opening 114b means, in other words, reducing a distance between the source electrode 116a and the drain electrode 116b which are to be formed later. That is, the distance between the source electrode 116a and the drain electrode 116b can be reduced to, for example, greater than or equal to 0.05 μm and less than or equal to 0.1 μm. By reducing the distance between the source electrode 116a and the drain electrode 116b, the resistance between the source and the drain can be reduced, so that electrical characteristics (e.g., on-state current characteristics) of the transistor 160 can be improved.

Figure 8B:
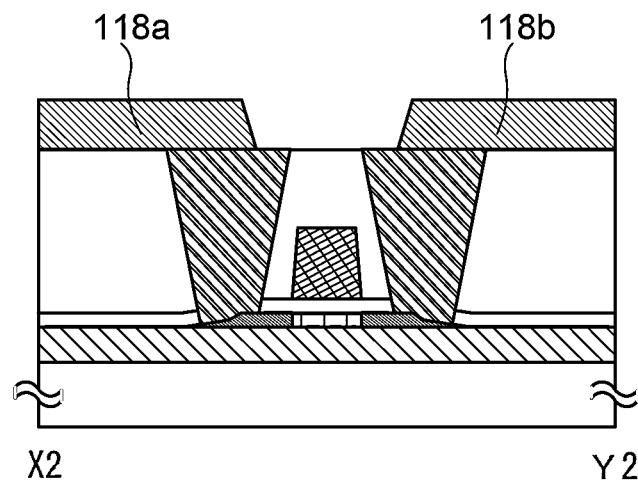

Next, a conductive film is formed over the interlayer insulating film 112, the source electrode 116a, and the drain electrode 116b, and a wiring 118a and a wiring 118b are formed through a photolithography step and an etching step (see FIG. 8B).

The wirings 118a and 118b can be formed using a material and a method similar to those of the gate electrode 110 or the source electrode 116a and the drain electrode 116b. For example, as the wiring 118a and the wiring 118b, a stack of a tantalum nitride film and a copper film or a stack of a tantalum nitride film and a tungsten film can be used.

Through the above process, the transistor 160 in this embodiment is formed.

In the semiconductor device described in this embodiment, the side surface of the oxide semiconductor film has a taper angle greater than or equal to 1° and less than 10°, and at least part of the source electrode and the drain electrode is in contact with the side surfaces of the oxide semiconductor film. With such a structure, the contact region can be increased. Further, the source electrode and the drain electrode can be in contact with the oxide semiconductor film without disconnection. Furthermore, the side surface of the oxide semiconductor film can be used as a contact region, whereby the area of the oxide semiconductor film can be reduced when an intended area of the contact region is required. Therefore, the size of the transistor can be sufficiently reduced.

By sufficiently reducing the size of the transistor, an area of a semiconductor device is decreased, and the number of semiconductor devices manufactured with one substrate is increased. Thus, the manufacturing cost per semiconductor device can be saved. In other words, miniaturization of a transistor including an oxide semiconductor is achieved according to one embodiment of the disclosed invention, and therefore a variety of advantageous effects accompanying the miniaturization can be obtained.

The methods and structures described in this embodiment can be combined as appropriate with any of the methods and structures described in the other embodiments.

(Embodiment 3)

In this embodiment, an example of a semiconductor device which includes the transistor described in this specification, can hold stored data even when not powered, and does not have a limitation on the number of write cycles will be described with reference to drawings.

Figure 9A:
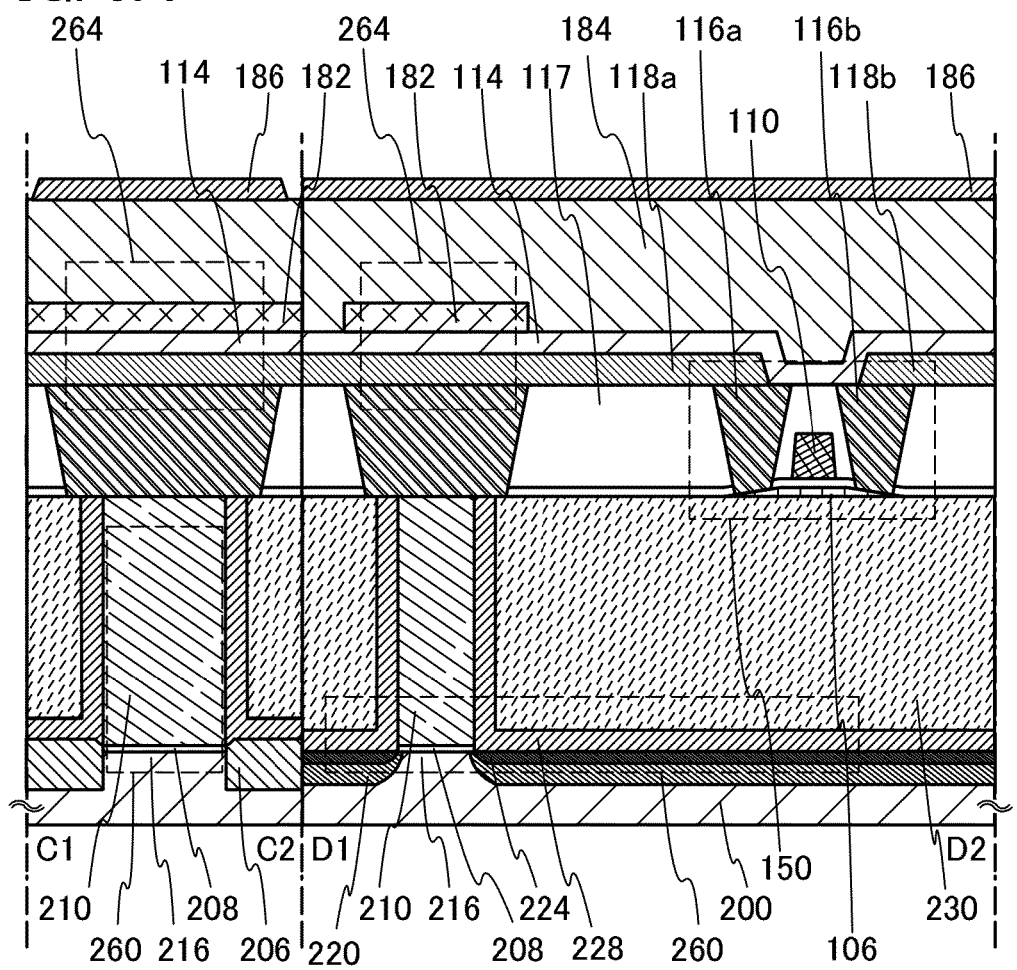
FIGS. 9A to 9C are a cross-sectional view, a plan view, and a circuit diagram of an embodiment of a semiconductor device.
Figure 9B:
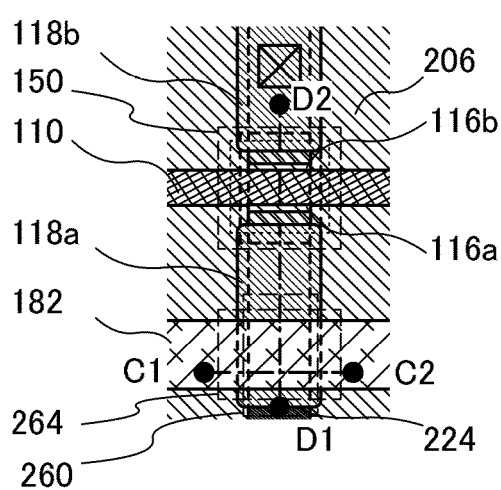
Figure 9C:
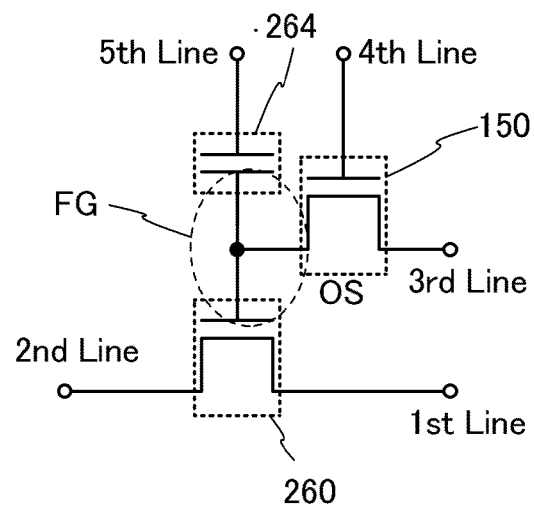

FIGS. 9A to 9C illustrate an example of a structure of a semiconductor device. FIGS. 9A to 9C illustrate a cross-sectional view, a plan view, and a circuit diagram, respectively, of the semiconductor device. Here, FIG. 9A corresponds to cross sections taken along lines C1-C2 and D1-D2 of FIG. 9B.

The semiconductor device illustrated in FIGS. 9A and 9B includes a transistor 260 including a first semiconductor material in a lower portion, and the transistor 150 including a second semiconductor material in an upper portion. The structure of the transistor described in Embodiment 1 can be applied to the transistor 150. Although not described in this embodiment, the transistor described in Embodiment 2 can also be employed.

Here, the first semiconductor material and the second semiconductor material are preferably materials having different band gaps. For example, the first semiconductor material can be a semiconductor material (such as silicon) other than an oxide semiconductor, and the second semiconductor material can be an oxide semiconductor. A transistor including a material other than an oxide semiconductor can operate at high speed easily. On the other hand, a transistor including an oxide semiconductor enables holding of charge for a long time owing to its characteristics.

Although all the transistors are n-channel transistors here, it is needless to say that p-channel transistors can be used. The specific constituent of the semiconductor device is not necessarily limited to those described here such as the material used for the semiconductor device and the structure of the semiconductor device as long as the transistor 150 described in Embodiment 1, which is formed using an oxide semiconductor, is used for holding data.

The transistor 260 in FIG. 9A includes a channel formation region 216 provided in a substrate 200 including a semiconductor material (e.g., silicon), impurity regions 220 provided such that the channel formation region 216 is sandwiched therebetween, intermetallic compound regions 224 in contact with the impurity regions 220, a gate insulating film 208 provided over the channel formation region 216, and a gate electrode 210 provided over the gate insulating film 208. Note that a transistor whose source electrode and drain electrode are not illustrated in a drawing may be referred to as a transistor for the sake of convenience. Further, in such a case, in description of a connection of a transistor, a source region and a source electrode may be collectively referred to as a "source electrode", and a drain region and a drain electrode may be collectively referred to as a "drain electrode". That is, in this specification, the term "source electrode" may include a source region.

An element isolation insulating film 206 is provided over the substrate 200 to surround the transistor 260. An insulating film 228 and an insulating film 230 are provided to cover the transistor 260. Note that in order to achieve high integration, the transistor 260 preferably has a structure without a sidewall insulating film as illustrated in FIG. 9A. On the other hand, when the characteristics of the transistor 260 have priority, a sidewall insulating film may be formed on a side surface of the gate electrode 210 and the impurity regions 220 may each include a region having a different impurity concentration.

The transistor 260 formed using a single crystal semiconductor substrate can operate at high speed. Thus, when the transistor is used as a reading transistor, data can be read at high speed. Two insulating films are formed so as to cover the transistor 260. As treatment prior to formation of the transistor 150 and a capacitor 264, CMP treatment is performed on the two insulating films so that the insulating film 228 and the insulating film 230 are formed to be planarized and an upper surface of the gate electrode 210 is exposed.

As the insulating film 228, an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film can be used typically. As the insulating film 230, an inorganic insulating film containing silicon oxide, such as a silicon oxide film, a silicon oxynitride film, or a silicon nitride oxide film can be used. The insulating film 228 and the insulating film 230 can be formed by a plasma CVD method, a sputtering method, or the like.

Alternatively, an organic material such as a polyimide-based resin, an acrylic-based resin, or a benzocyclobutene-based resin can be used for the insulating film 228. Other than such organic materials, it is also possible to use a low-dielectric constant material (a low-k material) or the like. In the case of using an organic material, the insulating film 228 may be formed by a wet method such as a spin coating method or a printing method.

Note that in this embodiment, a silicon nitride film is used as the insulating film 228, and a silicon oxide film is used as the insulating film 230.

The oxide semiconductor film 106 is formed over the insulating film 230 which is sufficiently planarized by polishing treatment (e.g., CMP treatment). The average surface roughness of the insulating film 230 is preferably less than or equal to 0.15 nm.

The transistor 150 illustrated in FIG. 9A includes an oxide semiconductor in the channel formation region. Here, the oxide semiconductor film 106 included in the transistor 150 is preferably highly purified. By using a highly purified oxide semiconductor, the transistor 150 which has extremely favorable off-state current characteristics can be obtained.

Since the off-state current of the transistor 150 is small, stored data can be held for a long time owing to such a transistor. In other words, power consumption can be sufficiently reduced because a semiconductor device in which refresh operation is unnecessary or the frequency of refresh operation is extremely low can be provided.

An insulating film 114 and an insulating film 184 each having a single-layer structure or a stacked-layer structure are provided over the transistor 150. In this embodiment, a stack in which a silicon oxide film and an aluminum oxide film are stacked from the gate electrode 110 side is used as the insulating film 114 and the insulating film 184. Note that when the aluminum oxide film has high density (e.g., a film density higher than or equal to 3.2 g/cm³, preferably higher than or equal to 3.6 g/cm³), the transistor 150 can have stable electric characteristics.

In addition, a conductive film 182 is provided in a region overlapping with the wiring 118a which is connected to the source electrode 116a of the transistor 150 with the insulating film 114 provided therebetween, and the wiring 118a, the insulating film 114, and the conductive film 182 form the capacitor 264. That is, the source electrode 116a of the transistor 150 functions as one electrode of the capacitor 264, and the conductive film 182 functions as the other electrode of the capacitor 264. Note that the capacitor 264 may be omitted if a capacitor is not needed. Alternatively, the capacitor 264 may be separately provided above the transistor 150.

The insulating film 184 is provided over the transistor 150 and the capacitor 264. Further, a wiring 186 for connecting the transistor 150 to another transistor is provided over the insulating film 184. Although not illustrated in FIG. 9A, the wiring 186 is electrically connected to the drain electrode 116b through an electrode formed in an opening provided in the insulating film 184, the insulating film 114, and the like. Here, the electrode is preferably provided so as to partly overlap with at least the oxide semiconductor film 106 of the transistor 150.

In FIGS. 9A and 9B, the transistor 260 and the transistor 150 are provided so as to at least partly overlap with each other. The source region or the drain region of the transistor 260 is preferably provided so as to overlap with part of the oxide semiconductor film 106. Further, the transistor 150 and the capacitor 264 are provided so as to overlap with at least part of the transistor 260. For example, the conductive film 182 of the capacitor 264 is provided so as to overlap with at least part of the gate electrode 210 of the transistor 260. With such a planar layout, the area occupied by the semiconductor device can be reduced; thus, higher integration can be achieved.

Note that the electrical connection between the wiring 118b and the wiring 186 may be established by direct contact of the wiring 118b and the wiring 186 with each other or through an electrode provided in an insulating film lying therebetween. Alternatively, the electrical connection may be established through a plurality of electrodes.

Next, an example of a circuit configuration corresponding to FIGS. 9A and 9B is illustrated in FIG. 9C.

In FIG. 9C, a first wiring (1st Line) is electrically connected to one of a source electrode and a drain electrode of the transistor 260, and a second wiring (2nd Line) is electrically connected to the other of the source electrode and the drain electrode of the transistor 260. A third wiring (3rd Line) is electrically connected to one of a source electrode and a drain electrode of the transistor 150, and a fourth wiring (4th Line) is electrically connected to a gate electrode of the transistor 150. A gate electrode of the transistor 260 and the other of the source electrode and the drain electrode of the transistor 150 are electrically connected to one electrode of the capacitor 264. A fifth wiring (5th Line) is electrically connected to the other electrode of the capacitor 264.

The semiconductor device in FIG. 9C utilizes a characteristic in which the potential of the gate electrode of the transistor 260 can be held, and can thus write, hold, and read data as follows.

Writing and holding of data is described. First, the potential of the fourth wiring is set to a potential at which the transistor 150 is turned on, so that the transistor 150 is turned on. Accordingly, the potential of the third wiring is supplied to the gate electrode of the transistor 260 and the capacitor 264. That is, predetermined charge is given to the gate electrode of the transistor 260 (writing). Here, one of two kinds of charges providing different potentials (hereinafter referred to as a low-level charge and a high-level charge) is applied. After that, the potential of the fourth wiring is set to a potential at which the transistor 150 is turned off, so that the transistor 150 is turned off. Thus, the charge given to the gate electrode of the transistor 260 is held (holding).

Since the off-state current of the transistor 150 is extremely small, the charge of the gate electrode of the transistor 260 is held for a long time.

Next, reading of data is described. By supplying an appropriate potential (reading potential) to the fifth wiring while a predetermined potential (constant potential) is supplied to the first wiring, the potential of the second wiring varies depending on the amount of charge held in the gate electrode of the transistor 260. This is because in general, when the transistor 260 is an n-channel transistor, an apparent threshold voltage $V_{th\_H}$ in the case where a high-level charge is given to the gate electrode of the transistor 260 is lower than an apparent threshold voltage $V_{th\_L}$ in the case where a low-level charge is given to the gate electrode of the transistor 160. Here, an apparent threshold voltage refers to the potential of the fifth wiring, which is needed to turn on the transistor 260. Thus, the potential of the fifth wiring is set to a potential $V_0$ that is between $V_{th\_H}$ and $V_{th\_L}$, whereby charge given to the gate electrode of the transistor 260 can be determined. For example, in the case where a high-level charge is given in writing, when the potential of the fifth wiring is set to $V_0$ ($>V_{th\_H}$), the transistor 260 is turned on. In the case where a low level charge is given in writing, even when the potential of the fifth wiring is set to $V_0$ ($<V_{th\_L}$), the transistor 260 remains in an off state. Therefore, the data held can be read by the potential of the second wiring.

Note that in the case where memory cells are arrayed, only data of a desired memory cell needs to be read. In the case where data is not read out, a potential at which the transistor 260 is turned off regardless of the state of the gate electrode, that is, a potential lower than $V_{th\_H}$ may be applied to the fifth wiring. Alternatively, a potential which allows the transistor 260 to be turned on regardless of the state of the gate electrode, that is, a potential higher than $V_{th\_L}$ may be applied to the fifth wiring.

When a transistor having a channel formation region formed using an oxide semiconductor and having extremely small off-state current is applied to the semiconductor device in this embodiment, the semiconductor device can hold stored data for an extremely long period. In other words, power consumption can be adequately reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate, and thus a problem such as deterioration of a gate insulating layer does not occur at all. In other words, the semiconductor device according to an embodiment of the present invention does not have a limit on the number of times of writing which is a problem in a conventional non-volatile memory, and reliability thereof is drastically improved. Furthermore, data is written depending on the on state and the off state of the transistor, whereby high-speed operation can be easily realized.

In the transistor 150, at least part of the source electrode 116a and the drain electrode 116b is in contact with the side surfaces of the oxide semiconductor film 106. The side surface of the oxide semiconductor film 106 has a taper angle greater than or equal to 1° and less than 10°, so that a contact region of the oxide semiconductor film 106 and the source electrode 116a or the drain electrode 116b can be increased. Further, the source electrode 116a and the drain electrode 116b can be in contact with the oxide semiconductor film 106 without disconnection. Furthermore, the side surface of the oxide semiconductor film 106 can be used as a contact region, whereby the area of the oxide semiconductor film 106 can be reduced when an intended area of the contact region is required. Accordingly, the size of the transistor 150 can be sufficiently reduced.

Accordingly, a semiconductor device in which miniaturization and high integration are achieved and which has high electric characteristics can be provided.

The structure, method, and the like described in this embodiment can be combined as appropriate with any of the structures, methods, and the like described in the other embodiments.

(Embodiment 4)

In this embodiment, a semiconductor device which includes the transistor described in Embodiment 1 or 2, can hold stored data even when not powered, and does not have a limitation on the number of write cycles, and which has a structure different from the structure described in Embodiment 3 is described with reference to FIGS. 10A and 10B and FIGS. 11A and 11B.

Figure 10A:
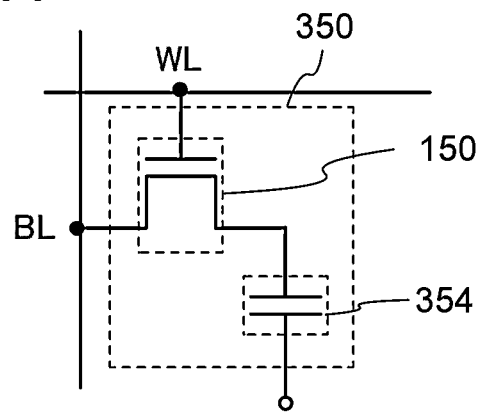
FIGS. 10A and 10B are a circuit diagram and a perspective view illustrating one embodiment of a semiconductor device.
Figure 10B:
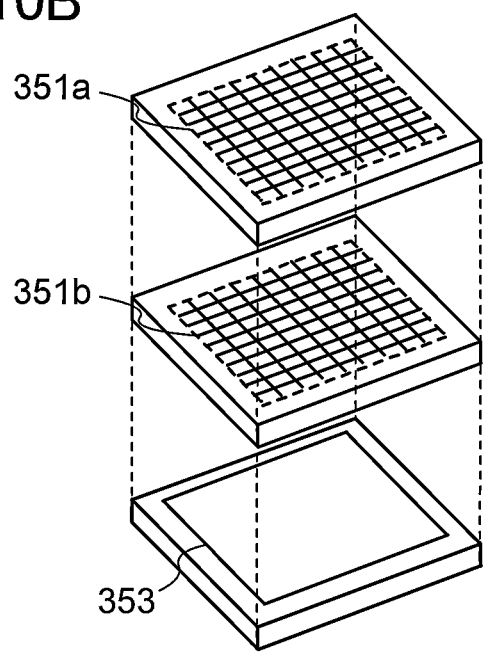

FIG. 10A illustrates an example of a circuit configuration of a semiconductor device, and FIG. 10B is a conceptual diagram illustrating an example of a semiconductor device. First, the semiconductor device illustrated in FIG. 10A is described, and then, the semiconductor device illustrated in FIG. 10B is described.

In the semiconductor device illustrated in FIG. 10A, a bit line BL is electrically connected to the source electrode or the drain electrode of the transistor 150, a word line WL is electrically connected to the gate electrode of the transistor 150, and the source electrode or the drain electrode of the transistor 150 is electrically connected to a first terminal of a capacitor 354.

Off-state current of the transistor 150 formed using an oxide semiconductor is extremely small. For that reason, the potential of the first terminal of the capacitor 354 (or a charge accumulated in the capacitor 354) can be held for an extremely long period by turning off the transistor 150.

Next, writing and holding of data in the semiconductor device (a memory cell 350) illustrated in FIG. 10A will be described.

First, the potential of the word line WL is set to a potential at which the transistor 150 is turned on, so that the transistor 150 is turned on. Accordingly, the potential of the bit line BL is supplied to the first terminal of the capacitor 354 (writing). After that, the potential of the word line WL is set to a potential at which the transistor 150 is turned off, so that the transistor 150 is turned off. Thus, the potential of the first terminal of the capacitor 354 is held (holding).

Since the off-state current of the transistor 150 is extremely small, the potential of the first terminal of the capacitor 354 (or the charge accumulated in the capacitor) can be held for a long time.

Next, reading of data is described. When the transistor 150 is turned on, the bit line BL which is in a floating state and the capacitor 354 are electrically connected to each other, and the charge is redistributed between the bit line BL and the capacitor 354. As a result, the potential of the bit line BL is changed. The amount of change in potential of the bit line BL varies depending on the potential of the first terminal of the capacitor 354 (or the charge accumulated in the capacitor 354).

For example, the potential of the bit line BL obtained after charge redistribution is $(CB \times VB0 + C \times V)/(CB+C)$, where V is the potential of the first terminal of the capacitor 354, C is the capacitance of the capacitor 354, CB is the capacitance of the bit line BL (hereinafter also referred to as bit line capacitance), and VB0 is the potential of the bit line BL obtained before the charge redistribution. Therefore, it can be found that the potential of the bit line BL, in the case of holding the potential V1, $(=(CB \times VB0 + C \times V1)/(CB+C))$ is higher than the potential of the bit line BL, in the case of holding the potential V0, $(=(CB \times VB0 + C \times V0)/(CB+C))$ assuming that the memory cell 350 is in either of two states in which the potentials of the first terminal of the capacitor 354 are V1 and V0 (V1>V0).

Then, by comparing the potential of the bit line BL with a predetermined potential, data can be read.

As described above, the semiconductor device illustrated in FIG. 10A can hold charge that is accumulated in the capacitor 354 for a long time because the off-state current of the transistor 150 is extremely small. In other words, power consumption can be adequately reduced because refresh operation becomes unnecessary or the frequency of refresh operation can be extremely low. Moreover, stored data can be held for a long time even when power is not supplied.

Next, the semiconductor device illustrated in FIG. 10B is described.

The semiconductor device illustrated in FIG. 10B includes memory cell arrays 351a and 351b including a plurality of memory cells 350 illustrated in FIG. 10A as memory circuits in an upper portion, and a peripheral circuit 353 for operating the memory cell arrays 351a and 351b in a lower portion. Note that the peripheral circuit 353 is electrically connected to the memory cell arrays 351a and 351b.

In the structure illustrated in FIG. 10B, the peripheral circuit 353 can be provided directly under the memory cell arrays 351a and 351b. Thus, the size of the semiconductor device can be decreased.

It is preferable that a semiconductor material of the transistor provided in the peripheral circuit 353 be different from that of the transistor 150. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, a variety of circuits (e.g., a logic circuit or a driver circuit) which needs to operate at high speed can be favorably achieved by using the transistor.

Note that FIG. 10B illustrates, as an example, the semiconductor device in which two memory cell arrays of the memory cell arrays 351a and 351b are stacked; however, the number of memory cell arrays to be stacked is not limited thereto. Three or more memory cell arrays may be stacked.

Next, a specific structure of the memory cell 350 illustrated in FIG. 10A is described with reference to FIGS. 11A and 11B.

Figure 11A:
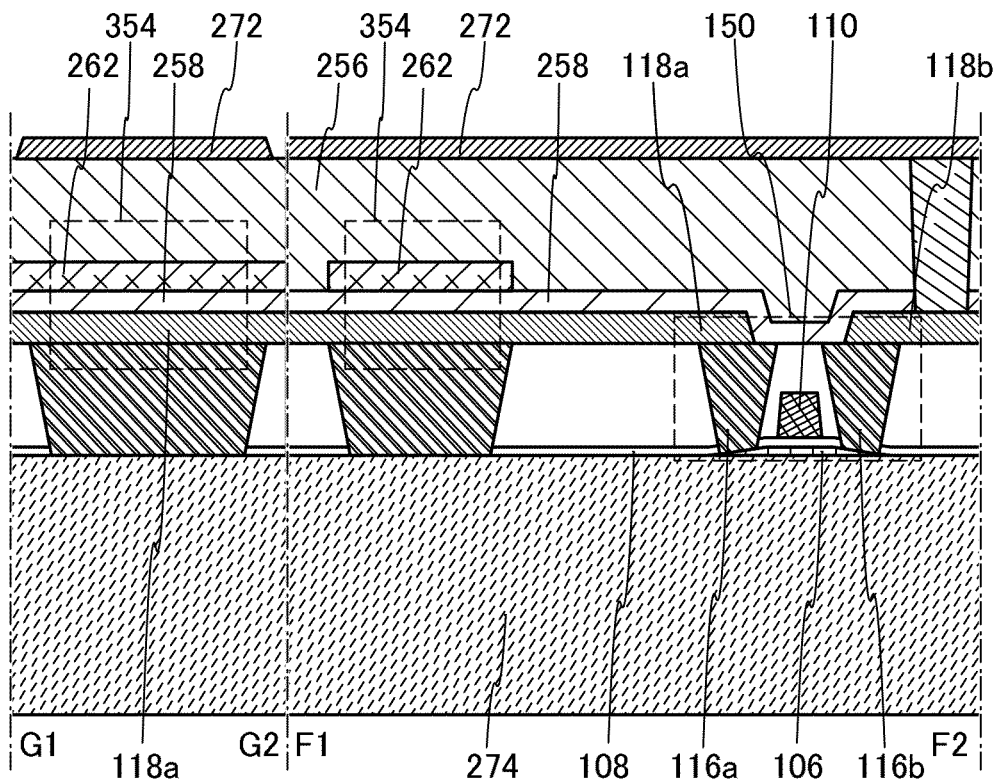
FIGS. 11A and 11B are a cross-sectional view and a plan view illustrating one embodiment of a semiconductor device.
Figure 11B:
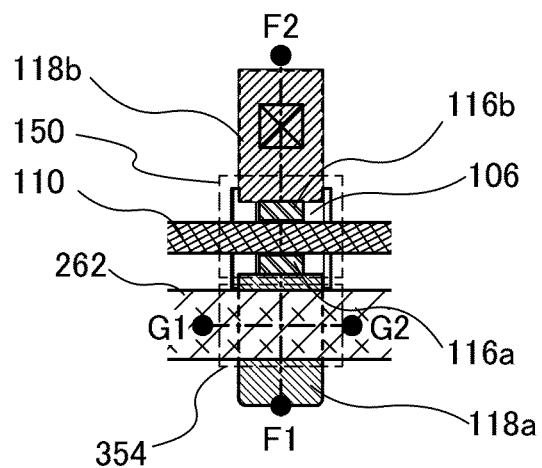

FIGS. 11A and 11B illustrate an example of a structure of the memory cell 350. FIG. 11A is a cross-sectional view of the memory cell 350, and FIG. 11B is a plan view of the memory cell 350. Here, FIG. 11A illustrates cross sections taken along line F1-F2 and line G1-G2 in FIG. 11B.

The transistor 150 in FIGS. 11A and 11B can have the same structure as the transistor in Embodiment 1.

The transistor 150 includes the oxide semiconductor film 106 formed over an insulating film 274, the gate insulating film 108 formed over the oxide semiconductor film 106, the gate electrode 110 which is in contact with the gate insulating film 108 and overlaps with at least the oxide semiconductor film 106, and the source electrode 116a and the drain electrode 116b which are electrically connected to the oxide semiconductor film 106.

Further, the source electrode 116a and the drain electrode 116b are electrically connected to the wiring 118a and the wiring 118b, respectively, and an insulating film 258 is formed over the transistor 150.

In the transistor 150, at least part of the source electrode 116a and the drain electrode 116b is in contact with the side surfaces of the oxide semiconductor film 106. The side surface of the oxide semiconductor film 106 has a taper angle greater than or equal to 1° and less than 10°, so that a contact region of the oxide semiconductor film 106 and the source electrode or the drain electrode 116b can be increased. Further, the source electrode 116a and the drain electrode 116b can be in contact with the oxide semiconductor film 106 without disconnection. Furthermore, the side surface of the oxide semiconductor film 106 can be used as a contact region, whereby the area of the oxide semiconductor film 106 can be reduced when an intended area of the contact region is required. Accordingly, the size of the transistor 150 can be sufficiently reduced.

In addition, a conductive film 262 is provided in a region overlapping with the wiring 118a which is connected to the source electrode 116a of the transistor 150 with the insulating film 258 provided therebetween, and the wiring 118a, the insulating film 258, and the conductive film 262 form the capacitor 354. That is, the source electrode 116a of the transistor 150 functions as one electrode of the capacitor 354, and the conductive film 262 functions as the other electrode of the capacitor 354.

An insulating film 256 having a single-layer structure or a stacked-layer structure is provided over the transistor 150 and the capacitor 354. In addition, a wiring 272 for connecting the memory cell to an adjacent memory cell is provided over the insulating film 256. The wiring 272 is electrically connected to the drain electrode 116b of the transistor 150 through an opening which is provided in the insulating film 256, the insulating film 258, and the like and the wiring 118b. Note that the wiring 272 and the drain electrode 116b may be directly connected to each other. The wiring 272 corresponds to the bit line BL in the circuit diagram of FIG. 10A.

In FIGS. 11A and 11B, the drain electrode 116b of the transistor 150 can also function as a source electrode layer of a transistor included in an adjacent memory cell. With such a planar layout, the area occupied by the semiconductor device can be reduced; thus, higher integration can be achieved.

In this manner, when the planar layout in FIG. 11B is employed, the area occupied by the semiconductor device can be reduced; thus, the degree of integration can be increased.

As described above, the plurality of memory cells formed in multiple layers is each formed with a transistor including an oxide semiconductor. Since the off-state current of the transistor including an oxide semiconductor is small, stored data can be held for a long time by using such a transistor. In other words, the frequency of refresh operation can be extremely lowered, which leads to a sufficient reduction in power consumption.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently small). In addition, the use of a structure where the peripheral circuit and the memory circuit are stacked leads to an increase in the degree of integration of the semiconductor device.

As described above, a semiconductor device in which miniaturization and high integration are achieved and which has high electric characteristics and a method for manufacturing the semiconductor device can be provided.

This embodiment can be implemented in appropriate combination with any of the structures described in the other embodiments.

(Embodiment 5)

In this embodiment, examples of application of the semiconductor device described in any of the above embodiments to portable devices such as mobile phones, smartphones, and e-book readers will be described with reference to FIGS. 12A and 12B, FIG. 13, FIG. 14, and FIG. 15.

In portable devices such as mobile phones, smartphones, and e-book readers, an SRAM or a DRAM is used to store image data temporarily. This is because response speed of a flash memory is low and thus a flash memory is not suitable for image processing. On the other hand, an SRAM or a DRAM has the following characteristics when used for temporary storage of image data.

Figure 12A:
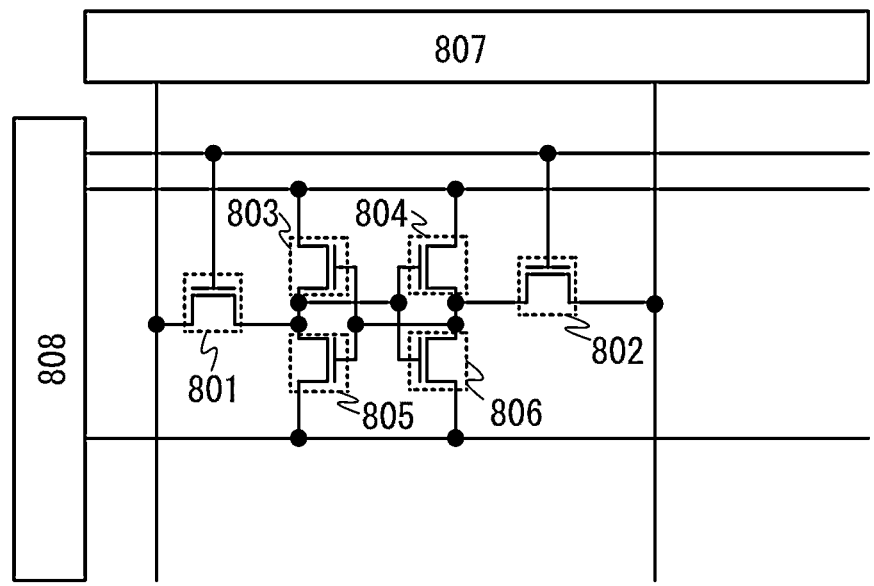
FIGS. 12A and 12B are each a circuit diagram illustrating one embodiment of a semiconductor device.

In a normal SRAM, as illustrated in FIG. 12A, one memory cell includes six transistors, which are a transistor 801, a transistor 802, a transistor 803, a transistor 804, a transistor 805, and a transistor 806, and they are driven by an X decoder 807 and a Y decoder 808. The transistors 803 and 805 and the transistors 804 and 806 each serve as an inverter, and high-speed driving can be performed therewith. However, an SRAM has a disadvantage of large cell area because one memory cell includes six transistors. Provided that the minimum feature size of a design rule is F, the area of a memory cell in an SRAM is generally $100 F^2$ to $150 F^2$. Therefore, a price per bit of an SRAM is the most expensive among a variety of memory devices.

Figure 12B:
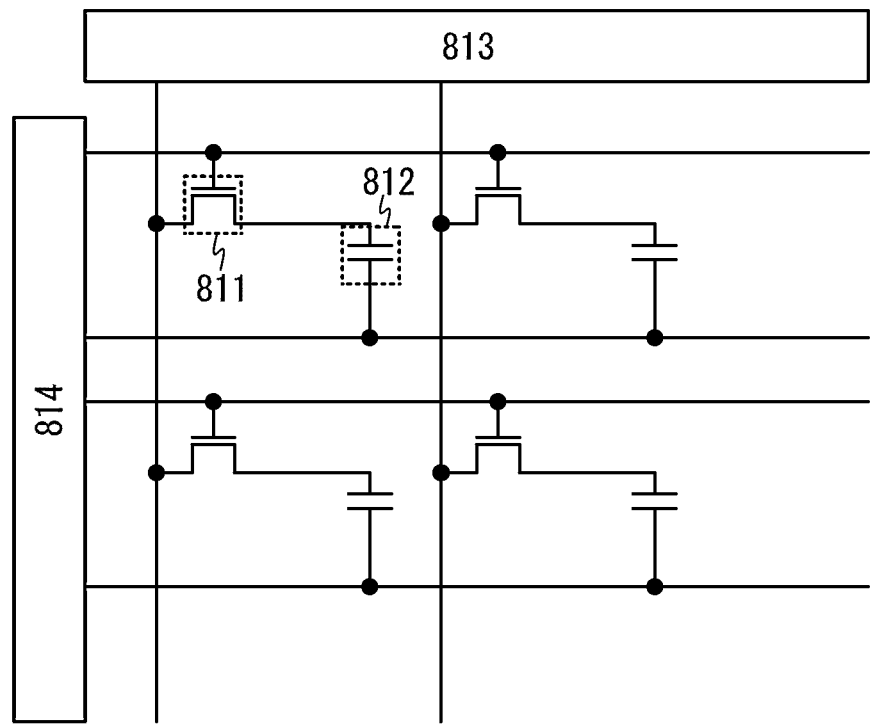

On the other hand, as illustrated in FIG. 12B, a memory cell in a DRAM includes a transistor 811 and a storage capacitor 812, which are driven by an X decoder 813 and a Y decoder 814. One cell includes one transistor and one capacitor and thus the area of a memory cell is small. The area of a memory cell of a DRAM is generally less than or equal to $10 F^2$. Note that in the case of a DRAM, refresh operation is always necessary and power is consumed even when rewriting operation is not performed.

However, the area of the memory cell of the semiconductor device described in any of the above embodiments is about $10 F^2$ and frequent refreshing is not needed. Therefore, the area of the memory cell is reduced, and the power consumption can be reduced.

Figure 13:
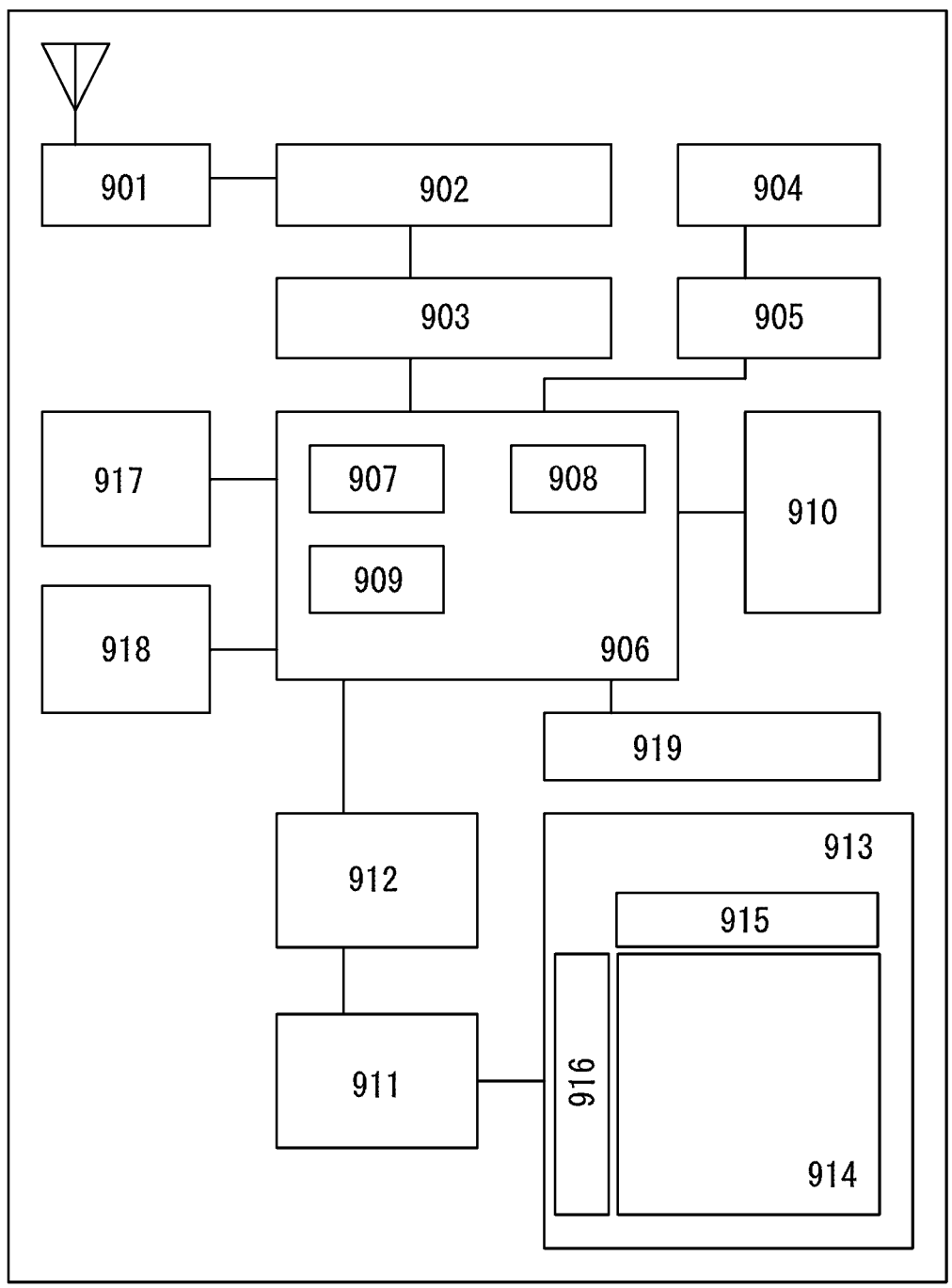
FIG. 13 is a block diagram illustrating one embodiment of a semiconductor device.

Next, a block diagram of a portable device is illustrated in FIG. 13. A portable device illustrated in FIG. 13 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface 909 (IF 909). In general, the memory circuit 912 includes an SRAM or a DRAM; by employing the semiconductor device described in any of the above embodiments for the memory circuit 912, writing and reading of data can be performed at high speed, data can be held for a long time, and power consumption can be sufficiently reduced.

Figure 14:
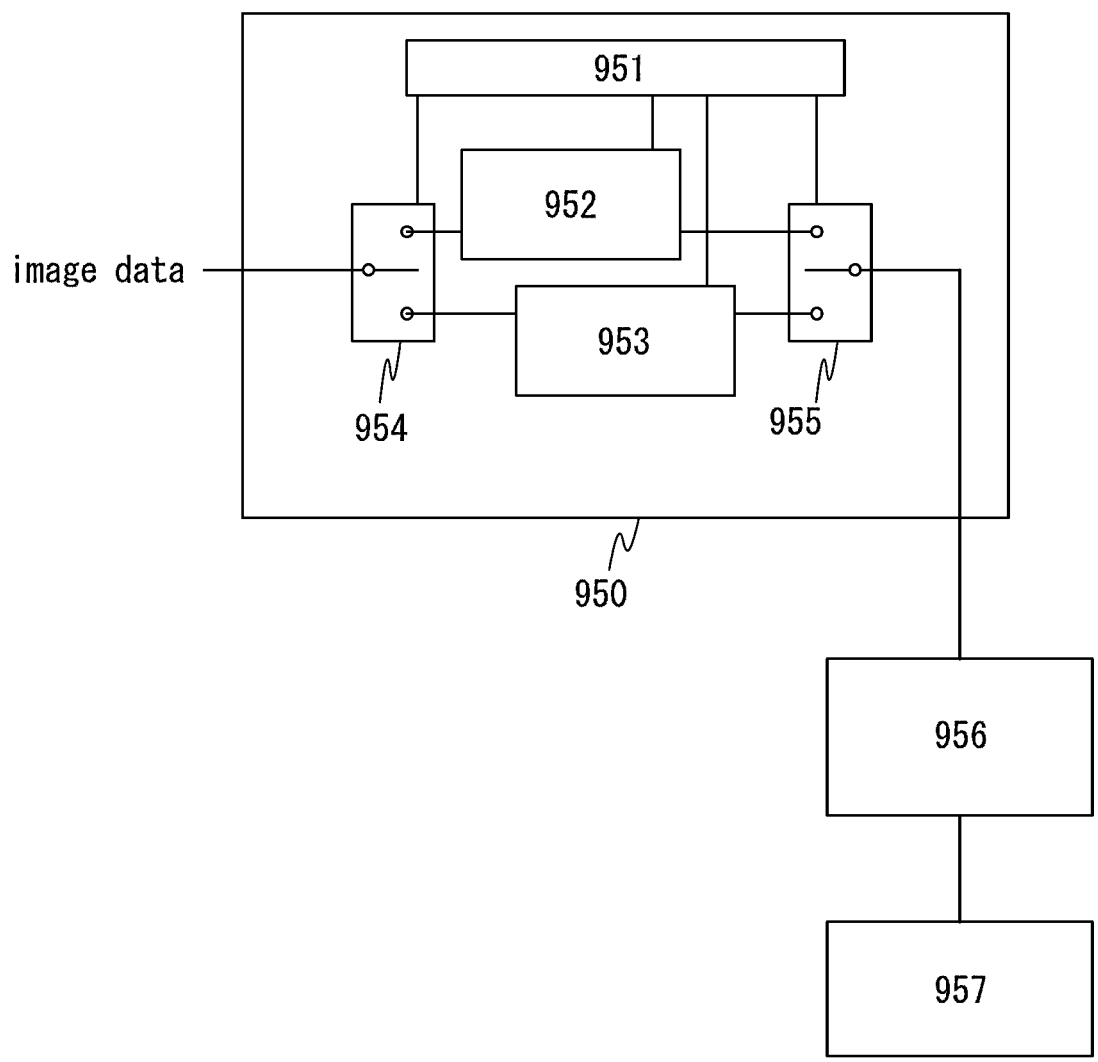
FIG. 14 is a block diagram illustrating one embodiment of a semiconductor device.

Next, FIG. 14 shows an example in which the semiconductor device described in any of the above embodiments is used for a memory circuit 950 in a display. The memory circuit 950 illustrated in FIG. 14 includes a memory 952, a memory 953, a switch 954, a switch 955, and a memory controller 951. Further, the memory circuit 950 is connected to a display controller 956 which reads and controls image data input through a signal line (input image data) and data stored in the memories 952 and 953 (stored image data), and is also connected to a display 957 which displays an image based on a signal input from the display controller 956.

First, image data (input image data A) is formed by an application processor (not shown). The input image data A is stored in the memory 952 though the switch 954. Then, the image data stored in the memory 952 (stored image data A) is transmitted to the display 957 through the switch 955 and the display controller 956, and is displayed on the display 957.

In the case where the input image data A is not changed, the stored image data A is read from the memory 952 through the switch 955 by the display controller 956 normally at a frequency of approximately 30 Hz to 60 Hz.

Next, for example, when data displayed on the screen is rewritten by a user (that is, in the case where the input image data A is changed), new image data (input image data B) is formed by the application processor. The input image data B is stored in the memory 953 through the switch 954. The stored image data A is read periodically from the memory 952 through the switch 955 even during that time. After the completion of storing the new image data (the stored image data B) in the memory 953, from the next frame for the display 957, the stored image data B starts to be read, transmitted to the display 957 through the switch 955 and the display controller 956, and displayed on the display 957. This reading operation is continued until another new image data is stored in the memory 952.

By alternately writing and reading image data to and from the memory 952 and the memory 953 as described above, images are displayed on the display 957. Note that the memory 952 and the memory 953 are not limited to separate memories, and a single memory may be divided and used. By employing the semiconductor device described in any of the above embodiments for the memory 952 and the memory 953, data can be written and read at high speed and held for a long time, and power consumption can be sufficiently reduced.

Figure 15:
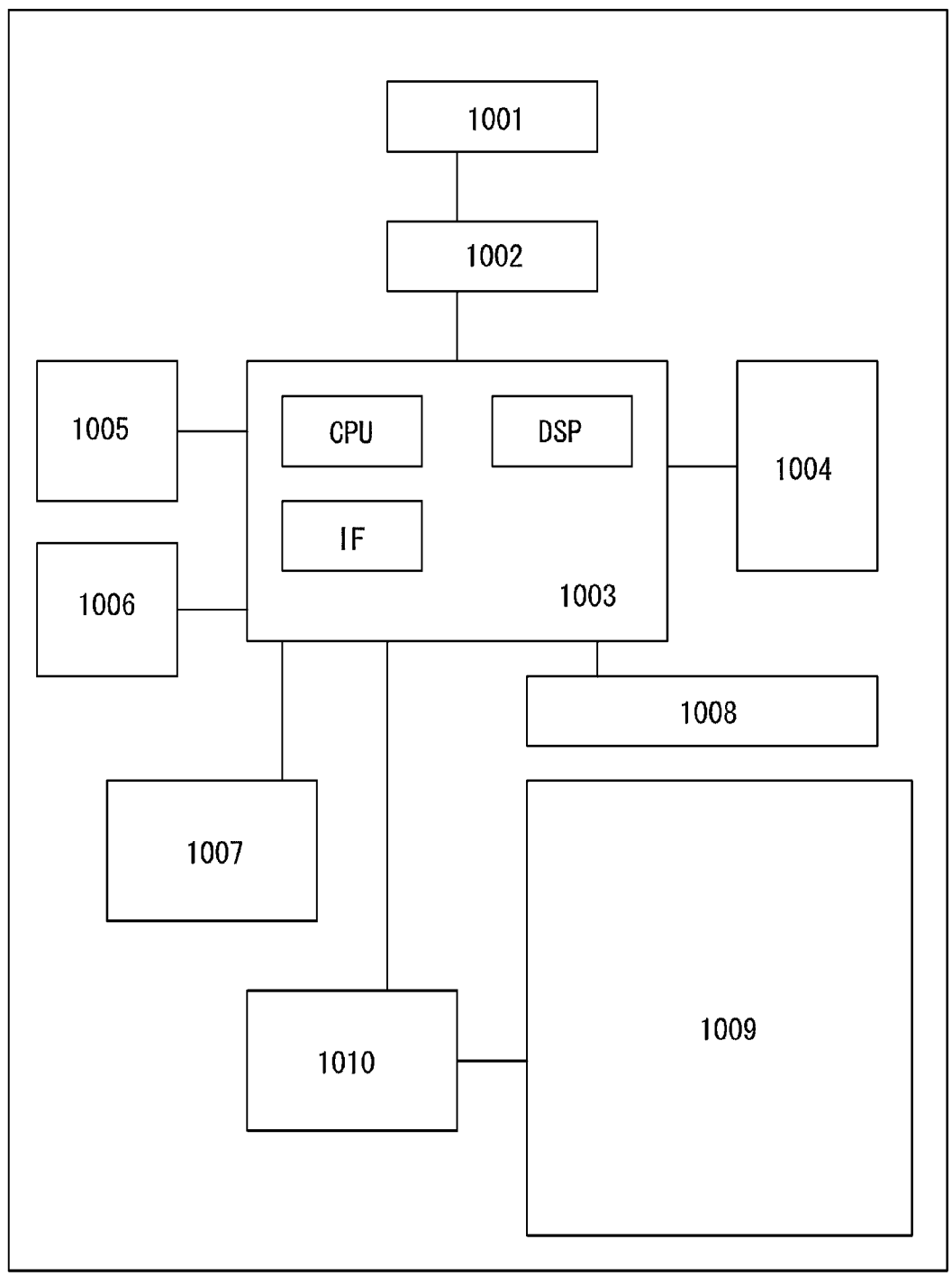
FIG. 15 is a block diagram illustrating one embodiment of a semiconductor device.

Next, FIG. 15 is a block diagram of an e-book reader. FIG. 15 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 15. The memory circuit 1007 has a function of temporarily storing the contents of a book. For example, a user may use a highlight function. In some cases, a user wants to mark a specific portion while reading an e-book reader. This marking refers to a highlight function, and is used to make a difference from the other portions by changing the display color, underlining, making characters bold, changing the font of characters, or the like. The function makes it possible to store and hold data of a portion specified by a user. In order to store the data for a long time, the data may be copied into the flash memory 1004. Also in such a case, the semiconductor device described in any of the above embodiments is used, whereby writing and reading of data can be performed at high speed, data can be stored for a long time, and power consumption can be sufficiently reduced.

As described above, the semiconductor device in any of the above embodiments is mounted on each of the portable devices described in this embodiment. Therefore, it is possible to obtain a portable device which is capable of reading data at high speed, storing data for a long time, and reducing power consumption.

The structure, method, and the like described in this embodiment can be combined as appropriate with any of the structures, methods, and the like described in the other embodiments.

EXAMPLE 1

In this example, an island-shaped oxide semiconductor film in which a side surface has a taper angle greater than or equal to 1° and less than 10° was manufactured, and the cross section was evaluated. Note that the cross section was observed with the use of a transmission electron microscope (TEM).

As samples for observing the cross section, two samples, Sample 1 and Sample 2, were manufactured. Manufacturing methods and observation results of the cross sections of Sample 1 and Sample 2 are shown below.

First, a manufacturing method of Sample 1 and an observation result of the cross section of Sample 1 are described below.

(Sample 1)

First, a silicon oxide film (hereinafter referred to as a $SiO_x$ film) was formed over a glass substrate as a base insulating film; then, an oxide semiconductor film (hereinafter referred to as an IGZO film) was formed.

The $SiO_x$ film was formed with a sputtering apparatus. The conditions for forming the $SiO_x$ film were as follows: the applied power was 1.5 kW (RF); the flow rate of an $O_2$ gas introduced into the sputtering apparatus was 25 sccm; the pressure was 0.4 Pa; and the substrate temperature was 100° C. Note that the thickness of the $SiO_x$ film was set to 300 nm, and a Si target was used as a sputtering target.

The IGZO film was formed with a sputtering apparatus. The conditions for forming the IGZO film were as follows: the applied power was 0.5 kW (DC); the flow rates of an Ar gas and an $O_2$ gas which were introduced into the sputtering apparatus were 30 sccm and 15 sccm, respectively; the pressure was 0.4 Pa; and the substrate temperature was 300° C. Note that the thickness of the IGZO film was set to 20 nm and a metal oxide target (In:Ga:Zn=1:1:1 [atomic ratio]) was used as a sputtering target.

Next, a photoresist (also referred to as P. R.) was formed over the IGZO film and the IGZO film was selectively etched.

A dry etching apparatus using ICP was used for etching the IGZO film. The conditions for dry etching were as follows: the power applied to a coil-shaped electrode was 450 W; the bias power applied to an electrode on the substrate side was 100 W (RF); the flow rates of a $BCl_3$ gas, a $Cl_2$ gas, and an $O_2$ gas which were introduced into the etching apparatus were 60 sccm, 20 sccm, and 10 sccm, respectively; the pressure was 1.9 Pa; and the substrate temperature was 70° C.

Figure 16:
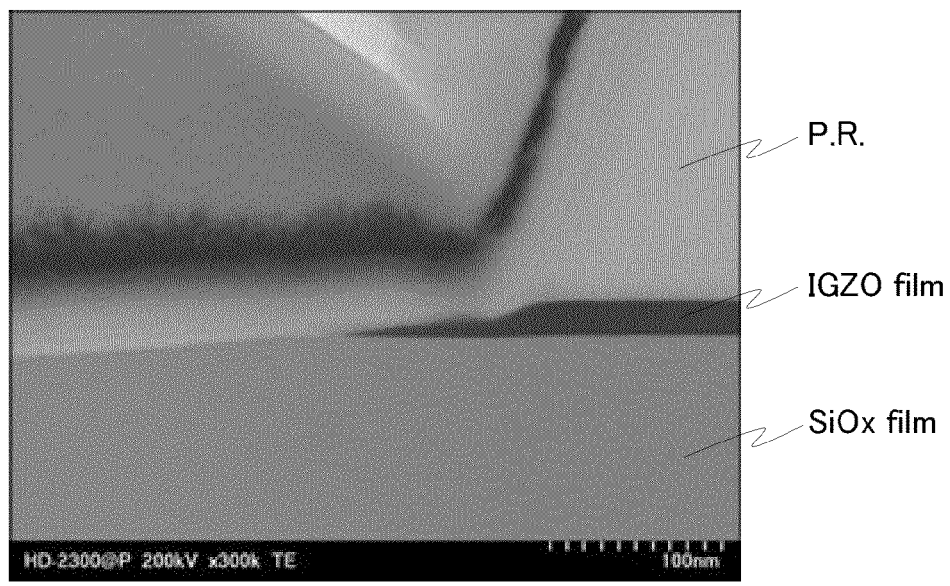
FIG. 16 shows an observation result of a cross section according to Example of the present invention.
Figure 17A:
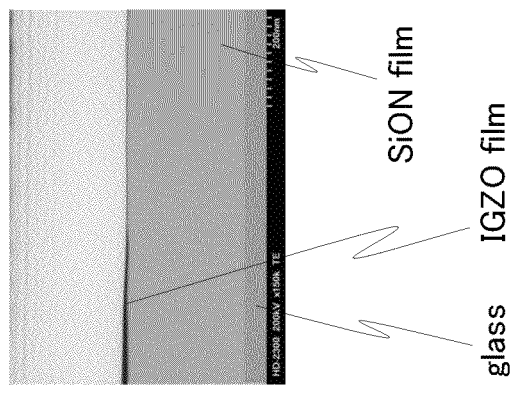
FIGS. 17A to 17D each show an observation result of a cross section according to Example of the present invention.
Figure 17B:
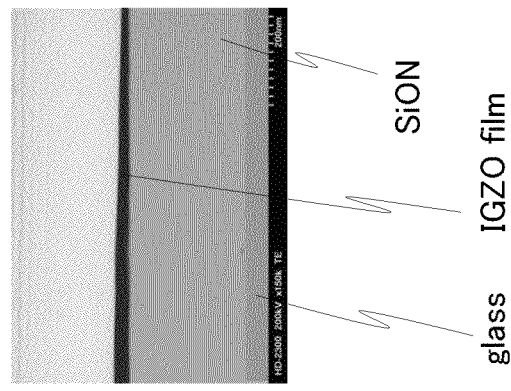
Figure 17C:
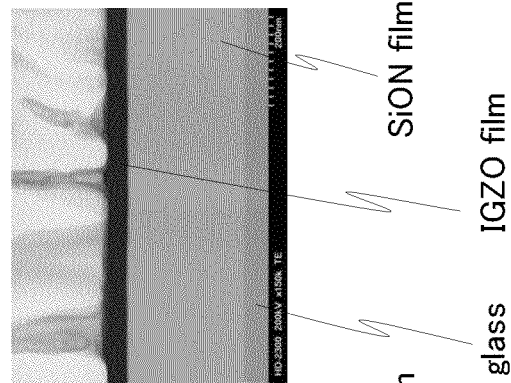
Figure 17D:
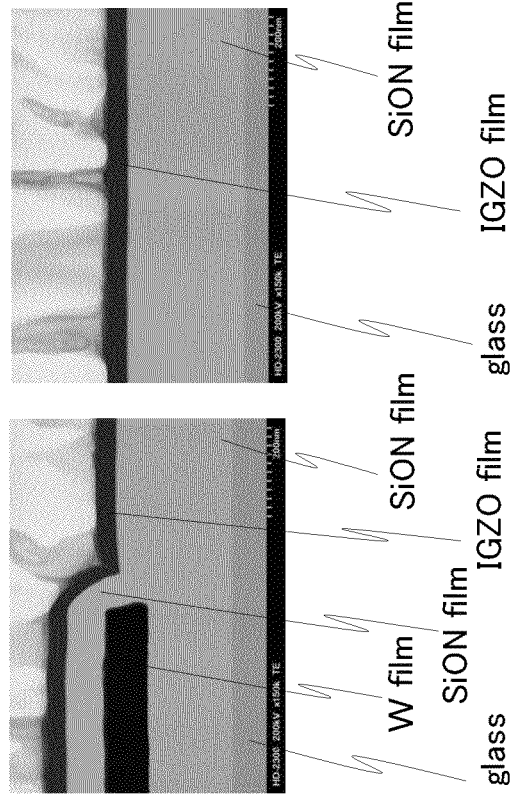

In this manner, Sample 1 for observing the cross section was manufactured. FIG. 16 shows an observation result of the cross section of Sample 1.

FIG. 16 indicates that a side surface of the IGZO film in Sample 1 has two taper angles. In addition, FIG. 16 also indicates that the taper angles are 5° and 9°.

Next, a manufacturing method of Sample 2 and an observation result of the cross section of Sample 2 are described below.

(Sample 2)

First, a silicon oxynitride film (hereinafter referred to as a SiON film) was formed over a glass substrate as a base insulating film.

The conditions for forming the SiON film were as follows: the applied power was 50 W (RF); the flow rates of a $SiH_4$ gas and an $N_2O$ gas which were introduced into a PE-CVD apparatus were 2.3 sccm and 800 sccm, respectively; the pressure was 40 Pa; and the substrate temperature was 400° C. Note that the thickness of the SiON film was set to 200 nm.

Then, a tungsten film (hereinafter referred to as a W film) was formed over the SiON film with a sputtering apparatus.

The conditions for forming the W film were as follows: the applied power was 6 kW (DC); the flow rate of an Ar gas introduced into the sputtering apparatus was 100 sccm; the pressure was 1.5 Pa; and the substrate temperature was 230° C. Note that the thickness of the W film was set to 100 nm, and a W target was used as a sputtering target.

Next, a photoresist was formed over the W film and the W film was selectively etched, so that the W film was processed to be island-shaped.

A dry etching apparatus using ICP was used for etching the W film. The conditions for dry etching were as follows: the power applied to a coil-shaped electrode was 500 W; the bias power applied to an electrode on the substrate side was 10 W (RF); the flow rates of a $CF_4$ gas, a $Cl_2$ gas, and an $O_2$ gas which were introduced into the etching apparatus were 25 sccm, 25 sccm, and 10 sccm, respectively; the pressure was 1.5 Pa; and the substrate temperature was 70° C.

Then, a SiON film was formed over the island-shaped W film with the PE-CVD apparatus.

The conditions for forming the SiON film were as follows: the applied power was 50 W (RF); the flow rates of a $SiH_4$ gas and an $N_2O$ gas which were introduced into the PE-CVD apparatus were 2.3 sccm and 800 sccm, respectively; the pressure was 40 Pa; and the substrate temperature was 400° C. Note that the thickness of the SiON film was set to 100 nm.

Next, an IGZO film was formed over the SiON film with the sputtering apparatus.

The conditions for forming the IGZO film were as follows: the applied power was 0.5 kW (DC); the flow rates of an Ar gas and an $O_2$ gas which were introduced into the sputtering apparatus were 30 sccm and 15 sccm, respectively; the pressure was 0.4 Pa; and the substrate temperature was 100° C. Note that the thickness of the IGZO film was set to 15 nm, and a metal oxide target (In:Ga:Zn=1:1:1 [atomic ratio]) was used as a sputtering target.

Then, a photoresist was formed over the IGZO film and the IGZO film was selectively etched.

A dry etching apparatus using ICP was used for etching the IGZO film. Further, a condition for the dry etching has two steps. The first step of the dry etching was performed under the following conditions: the power applied to a coil-shaped electrode was 2000 W; the bias power applied to an electrode on the substrate side was 600 W (RF); the flow rate of a $Cl_2$ gas introduced into the etching apparatus was 100 sccm; the pressure was 1.5 Pa; and the substrate temperature was −10° C. The second step of the dry etching was performed under the following conditions: the power applied to a coil-shaped electrode was 1500 W; the bias power applied to an electrode on the substrate side was 200 W (RF); the flow rates of a $Cl_2$ gas and an $O_2$ gas which were introduced into the etching apparatus were 100 sccm and 30 sccm, respectively; the pressure was 1.5 Pa; and the substrate temperature was −10° C.

After that, the photoresist over the IGZO film was removed.

In this manner, Sample 2 for observing the cross section was manufactured. FIGS. 17A to 17D each show an observation result of the cross section of Sample 2.

Note that, in observation results of the cross section of Sample 2 shown in FIGS. 17A to 17D, a whole image of the IGZO film was not obtained in one observation of the cross section; therefore, the cross section was observed four times in FIG. 17A, FIG. 17B, FIG. 17C, and FIG. 17D. Further, in observation results of the cross section of Sample 2 shown in FIGS. 17A to 17D, the SiON film formed as a base insulating film and the SiON film formed over the W film use the same kind of material; thus, the interface can not be clearly defined.

FIGS. 17A to 17D indicate that a side surface of the IGZO film in Sample 2 has a tapered-shape. FIGS. 17A to 17D also indicate that the taper angle is 2°.

This application is based on Japanese Patent Application serial no. 2011-245058 filed with Japan Patent Office on Nov. 9, 2011, the entire contents of which are hereby incorporated by reference.

What is claimed is:

1. A semiconductor device comprising:
an oxide semiconductor film having island-shaped;
a gate insulating film over the oxide semiconductor film;
a gate electrode being in contact with the gate insulating film and provided at a position overlapping with the oxide semiconductor film;
an interlayer insulating film over the gate insulating film and the gate electrode;
an opening formed in the gate insulating film and the interlayer insulating film and reaching the oxide semiconductor film; and
a source electrode or a drain electrode formed to fill the opening and being in contact with the oxide semiconductor film,
wherein a side surface of the oxide semiconductor film has a taper angle greater than or equal to 1° and less than 10°, and
wherein at least part of the source electrode or the drain electrode is in contact with the side surface.

2. The semiconductor device according to claim 1,
wherein the side surface of the oxide semiconductor film has a plurality of taper angles, and
wherein at least one of the plurality of taper angles is greater than or equal to 1° and less than 10°.

3. The semiconductor device according to claim 1,
wherein the oxide semiconductor film includes a channel formation region and a pair of low resistance regions with the channel formation region provided therebetween.

4. The semiconductor device according to claim 1,
wherein the oxide semiconductor film includes at least one of oxides of indium, zinc, gallium, zirconium, tin, gadolinium, titanium, and cerium.

5. The semiconductor device according to claim 1,
wherein the oxide semiconductor film includes a crystal portion, and
wherein the c-axis are aligned in the direction parallel to a normal vector of a surface where the oxide semiconductor film is formed in the crystal portion.

6. A semiconductor device comprising:
an oxide semiconductor film having island-shaped;
a gate insulating film over the oxide semiconductor film;
a gate electrode being in contact with the gate insulating film and provided at a position overlapping with the oxide semiconductor film;
an interlayer insulating film over the gate insulating film and the gate electrode;
an opening formed in the gate insulating film and the interlayer insulating film and reaching the oxide semiconductor film; and
a source electrode or a drain electrode formed to fill the opening and being in contact with the oxide semiconductor film,
wherein the oxide semiconductor film has a side surface with continuous curvature having a taper angle greater than or equal to 1° and less than 10°, and
wherein at least part of the source electrode or the drain electrode is in contact with the side surface.

7. The semiconductor device according to claim 6,
wherein the taper angle is a tilt angle formed by a bottom surface of the oxide semiconductor film and a given point of the side surface.

8. The semiconductor device according to claim 6,
wherein the oxide semiconductor film includes a channel formation region and a pair of low resistance regions with the channel formation region provided therebetween.

9. The semiconductor device according to claim 6,
wherein the oxide semiconductor film includes at least one of oxides of indium, zinc, gallium, zirconium, tin, gadolinium, titanium, and cerium.

10. The semiconductor device according to claim 6,
wherein the oxide semiconductor film includes a crystal portion, and
wherein the c-axis are aligned in the direction parallel to a normal vector of a surface where the oxide semiconductor film is formed in the crystal portion.

* * * * *